US011270765B2

(12) United States Patent
Hara et al.

(10) Patent No.: US 11,270,765 B2
(45) Date of Patent: Mar. 8, 2022

(54) NONVOLATILE MEMORY AND WRITING METHOD

(71) Applicant: Toshiba Memory Corporation, Tokyo (JP)

(72) Inventors: Tokumasa Hara, Kawasaki (JP); Noboru Shibata, Kawasaki (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 17/154,513

(22) Filed: Jan. 21, 2021

(65) Prior Publication Data

US 2021/0166755 A1 Jun. 3, 2021

Related U.S. Application Data

(63) Continuation of application No. 16/919,860, filed on Jul. 2, 2020, now Pat. No. 10,937,490, which is a (Continued)

(30) Foreign Application Priority Data

Mar. 18, 2014 (JP) ................................ 2014-055408
Apr. 14, 2014 (JP) ................................ 2014-083044

(51) Int. Cl.
*G11C 11/56* (2006.01)
*G11C 16/04* (2006.01)

(52) U.S. Cl.
CPC ...... *G11C 11/5628* (2013.01); *G11C 11/5642* (2013.01); *G11C 16/0483* (2013.01); (Continued)

(58) Field of Classification Search
CPC ........... G11C 11/5628; G11C 11/5642; G11C 16/0483; G11C 2211/5646; G11C 2211/5641
See application file for complete search history.

(56) References Cited

U.S. PATENT DOCUMENTS 6,243,290 B1 * 6/2001 Kurata ............... G11C 11/5621 365/185.03
7,349,249 B2 3/2008 Honma et al.
(Continued)

FOREIGN PATENT DOCUMENTS

CN 101409107 B 5/2013
JP 2001-93288 A 4/2001
(Continued)

*Primary Examiner* — Jay W. Radke
(74) *Attorney, Agent, or Firm* — Oblon, McClelland, Maier & Neustadt, L.L.P.

(57) ABSTRACT

According to one embodiment, three bits stored in one memory cell of a nonvolatile memory correspond to three pages. In first page writing, a threshold voltage becomes within a first or second region base on a bit value. In second page writing, if being within the first region, it becomes within the first or fourth region; and if being within the second region, it becomes within the second or third region. In the third page writing, if being within the first region, it becomes within the first or sixth region; if being within the second region, it becomes within the second or seventh region; being within the third region, it becomes within the third or eighth region; and if being within the fourth region, it becomes within the fourth or fifth region.

18 Claims, 28 Drawing Sheets

Related U.S. Application Data continuation of application No. 16/529,322, filed on Aug. 1, 2019, now Pat. No. 10,790,017, which is a continuation of application No. 16/286,056, filed on Feb. 26, 2019, now Pat. No. 10,431,298, which is a continuation of application No. 14/621,894, filed on Feb. 13, 2015, now Pat. No. 10,255,971.

(52) U.S. Cl.
CPC ................. *G11C 2211/5641* (2013.01); *G11C 2211/5646* (2013.01)

(56) References Cited

U.S. PATENT DOCUMENTS

| | | | |
|---|---|---|---|
| 7,505,315 | B2 | 3/2009 | Honma et al. |
| 7,623,372 | B2 | 11/2009 | Kouno |
| 8,054,684 | B2 | 11/2011 | Gorobets et al. |
| 8,144,510 | B1 | 3/2012 | Yang |
| 8,180,994 | B2 | 5/2012 | Sprouse et al. |
| 8,472,280 | B2 | 6/2013 | Li |
| 8,473,809 | B2 | 6/2013 | Wan et al. |
| 8,605,500 | B2 | 12/2013 | Kobayashi et al. |
| RE45,771 | E | 10/2015 | Sprouse et al. |
| 2006/0215450 | A1 | 9/2006 | Honma et al. |
| 2007/0153574 | A1 | 7/2007 | Kouno |
| 2007/0195602 | A1 | 8/2007 | Fong |
| 2008/0062758 | A1 | 3/2008 | Honma |
| 2008/0136501 | A1 | 6/2008 | Suzuki |
| 2008/0137416 | A1 | 6/2008 | Lee |
| 2008/0144370 | A1 | 6/2008 | Park |
| 2008/0158973 | A1 | 7/2008 | Mui |
| 2008/0198650 | A1 | 8/2008 | Shalvi |
| 2008/0247241 | A1 | 10/2008 | Nguyen |
| 2008/0247254 | A1 | 10/2008 | Nguyen |
| 2009/0244980 | A1 | 10/2009 | Seol |
| 2010/0037007 | A1 | 2/2010 | Futatsuyama |
| 2010/0254189 | A1 | 10/2010 | Cho |
| 2011/0010484 | A1 | 1/2011 | Sprouse et al. |
| 2011/0038207 | A1 | 2/2011 | Eun et al. |
| 2011/0044104 | A1 | 2/2011 | Kang |
| 2011/0044105 | A1 | 2/2011 | Lim et al. |
| 2011/0145668 | A1 | 6/2011 | Kim |
| 2011/0149650 | A1 | 6/2011 | Huang |
| 2011/0153912 | A1 | 6/2011 | Gorobets |
| 2011/0194347 | A1 | 8/2011 | Chae |
| 2011/0205805 | A1 | 8/2011 | Honma et al. |
| 2012/0005416 | A1 | 1/2012 | Lee |
| 2012/0008397 | A1 | 1/2012 | Shin |
| 2012/0054416 | A1 | 3/2012 | Kobayashi et al. |
| 2012/0057409 | A1 | 3/2012 | Lee |
| 2013/0028017 | A1 | 1/2013 | Hendrickson |
| 2015/0071008 | A1 | 3/2015 | Yang |
| 2015/0082120 | A1 * | 3/2015 | Yang ...................... G11C 16/10 714/764 |

FOREIGN PATENT DOCUMENTS

| | | | |
|---|---|---|---|
| JP | 2006-277785 | A | 10/2006 |
| JP | 2009-59453 | A | 3/2009 |
| JP | 4233563 | B2 | 3/2009 |
| JP | 2011-165305 | A | 8/2011 |
| JP | 2012-048791 | A | 3/2012 |
| JP | 4892307 | B2 | 3/2012 |
| JP | 2012-533139 | A | 12/2012 |
| JP | 6470389 | B2 | 2/2019 |

* cited by examiner

| PAGE | DATA | | | | | | | |
|---|---|---|---|---|---|---|---|---|
| UPPER | 1 | 1 | 1 | 1 | 0 | 0 | 0 | 0 |
| MIDDLE | 1 | 1 | 0 | 0 | 0 | 1 | 1 | 0 |
| LOWER | 1 | 0 | 0 | 1 | 1 | 1 | 0 | 0 |
| | | Vr1 | Vr2 | Vr3 | Vr4 | Vr5 | Vr6 | Vr7 |

FIG.11A

| PAGE | DATA | | | | | | | |
|---|---|---|---|---|---|---|---|---|
| UPPER | 1 | 1 | 1 | 1 | 0 | 0 | 0 | 0 |
| MIDDLE | 1 | 0 | 1 | 1 | 1 | 1 | 0 | 0 |
| LOWER | 1 | 1 | 0 | 0 | 0 | 1 | 0 | 0 |

CHANGED DATA ALLOCATION

NONEXISTENT THRESHOLD DISTRIBUTION

FIG.11B

| PAGE | DATA | | | | | | | |
|---|---|---|---|---|---|---|---|---|
| UPPER | 1 | 1 | 1 | 1 | 0 | 0 | 0 | 0 |
| MIDDLE | 1 | 0 | 0 | 1 | 1 | 1 | 0 | 0 |
| LOWER | 1 | 1 | 0 | 0 | 0 | 1 | 0 | 0 |

FIG.17A

CHANGED DATA ALLOCATION

NONEXISTENT THRESHOLD DISTRIBUTION

| PAGE | DATA | | | | | | | |
|---|---|---|---|---|---|---|---|---|
| UPPER | 1 | 0 | 0 | 1 | 1 | 1 | 0 | 0 |
| MIDDLE | 1 | 1 | 0 | 0 | 1 | 1 | 1 | 0 |
| LOWER | 1 | 1 | 1 | 1 | 0 | 0 | 0 | 0 |

FIG.17B

| PAGE | DATA | | | | | | | |
|---|---|---|---|---|---|---|---|---|
| UPPER | 1 | 0 | 1 | 1 | 1 | 1 | 0 | 0 |
| MIDDLE | 1 | 1 | 0 | 0 | 0 | 1 | 1 | 0 |
| LOWER | 1 | 1 | 1 | 1 | 0 | 0 | 0 | 0 |

FIG.17C

| PAGE | DATA | | | | | | | |
|---|---|---|---|---|---|---|---|---|
| UPPER | 1 | 0 | 0 | 1 | 1 | 1 | 0 | 0 |
| MIDDLE | 1 | 1 | 0 | 0 | 0 | 1 | 1 | 0 |
| LOWER | 1 | 1 | 1 | 1 | 0 | 0 | 0 | 0 |

FIG.19A

CHANGED DATA ALLOCATION

NONEXISTENT THRESHOLD DISTRIBUTION

| PAGE | DATA | | | | | | | |
|---|---|---|---|---|---|---|---|---|
| UPPER | 1 | 1 | 0 | 0 | 1 | 1 | 1 | 0 |
| MIDDLE | 1 | 0 | 0 | 1 | 1 | 1 | 0 | 0 |
| LOWER | 1 | 1 | 1 | 1 | 0 | 0 | 0 | 0 |

FIG.19B

| PAGE | DATA | | | | | | | |
|---|---|---|---|---|---|---|---|---|
| UPPER | 1 | 1 | 0 | 0 | 1 | 1 | 1 | 0 |
| MIDDLE | 1 | 0 | 0 | 1 | 1 | 1 | 0 | 0 |
| LOWER | 1 | 1 | 1 | 1 | 0 | 0 | 0 | 0 |

FIG.19C

| PAGE | DATA | | | | | | | |
|---|---|---|---|---|---|---|---|---|
| UPPER | 1 | 1 | 0 | 0 | 0 | 1 | 1 | 0 |
| MIDDLE | 1 | 0 | 0 | 1 | 1 | 1 | 0 | 0 |
| LOWER | 1 | 1 | 1 | 1 | 0 | 0 | 0 | 0 |

FIG.21A

CHANGED DATA ALLOCATION

NONEXISTENT THRESHOLD DISTRIBUTION

| PAGE | DATA | | | | | | | |
|---|---|---|---|---|---|---|---|---|
| UPPER | 1 | 0 | 1 | 1 | 1 | 1 | 0 | 0 |
| MIDDLE | 1 | 1 | 1 | 1 | 0 | 0 | 0 | 0 |
| LOWER | 1 | 1 | 0 | 0 | 0 | 1 | 1 | 0 |

FIG.21B

| PAGE | DATA | | | | | | | |
|---|---|---|---|---|---|---|---|---|
| UPPER | 1 | 0 | 1 | 1 | 1 | 1 | 0 | 0 |
| MIDDLE | 1 | 1 | 1 | 1 | 0 | 0 | 0 | 0 |
| LOWER | 1 | 1 | 0 | 0 | 0 | 1 | 1 | 0 |

FIG.21C

| PAGE | DATA | | | | | | | |
|---|---|---|---|---|---|---|---|---|
| UPPER | 1 | 0 | 0 | 1 | 1 | 1 | 0 | 0 |
| MIDDLE | 1 | 1 | 1 | 1 | 0 | 0 | 0 | 0 |
| LOWER | 1 | 1 | 0 | 0 | 0 | 1 | 1 | 0 |

FIG.23A

| PAGE | DATA | | | | | | | |
|---|---|---|---|---|---|---|---|---|
| UPPER | 1 | 1 | 0 | 0 | 0 | 1 | 1 | 0 |
| MIDDLE | 1 | 1 | 1 | 1 | 0 | 0 | 0 | 0 |
| LOWER | 1 | 0 | 0 | 1 | 1 | 1 | 0 | 0 |

FIG.23B

CHANGED DATA ALLOCATION

NONEXISTENT THRESHOLD DISTRIBUTION

| PAGE | DATA | | | | | | | |
|---|---|---|---|---|---|---|---|---|
| UPPER | 1 | 1 | 0 | 0 | 1 | 1 | 1 | 0 |
| MIDDLE | 1 | 1 | 1 | 1 | 0 | 0 | 0 | 0 |
| LOWER | 1 | 0 | 0 | 1 | 1 | 1 | 0 | 0 |

FIG.23C

| PAGE | DATA | | | | | | | |
|---|---|---|---|---|---|---|---|---|
| UPPER | 1 | 1 | 0 | 0 | 0 | 1 | 1 | 0 |
| MIDDLE | 1 | 1 | 1 | 1 | 0 | 0 | 0 | 0 |
| LOWER | 1 | 0 | 0 | 1 | 1 | 1 | 0 | 0 |

NONVOLATILE MEMORY AND WRITING METHOD

CROSS-REFERENCE TO RELATED APPLICATIONS

This application is a Continuation of U.S. application Ser. No. 16/919,860 filed Jul. 2, 2020, which is a Continuation of U.S. application Ser. No. 16/529,322 filed Aug. 1, 2019, which is a Continuation of U.S. application Ser. No. 16/286,056 filed Feb. 26, 2019, which is a Continuation of U.S. application Ser. No. 14/621,894, filed Feb. 13, 2015, which is based upon and claims the benefit of priority from the prior Japanese Patent Application No. 2014-055408, filed on Mar. 18, 2014, and Japanese Patent Application No. 2014-083044, filed on Apr. 14, 2014; the entire contents of each of which are incorporated herein by reference.

FIELD

Embodiments described herein relate generally to a nonvolatile memory and writing method.

BACKGROUND

A NAND flash memory (which will be referred to as a NAND memory) stores information based on charge amounts respectively stored in the floating gates of memory cells. Each of the memory cells has a threshold voltage in accordance with its charge amount. A plurality of data values to be stored in the memory cells are respectively correlated with a plurality of regions of threshold voltage, and electric charges are injected to the memory cells so that their threshold voltages fall within respective regions corresponding to data values to be stored. Then, in reading, the threshold voltages of the memory cells are judged in terms of regions where the threshold voltages are present, to obtain the data values stored in the memory cells.

In the case of a NAND memory of the 3-bit/Cell type that is capable of storing three bits in one memory cell, the number of threshold voltage regions is larger, as compared with a NAND memory of the 1-bit/Cell type that is capable of storing one bit in one memory cell and a NAND memory of the 2-bit/Cell type that is capable of storing two bits in one memory cell. Accordingly, as compared with NAND memories of the 1-bit/Cell type and the 2-bit/Cell type, a NAND memory of the 3-bit/Cell type requires higher adjustment accuracy of threshold voltages and entails larger influence of mutual interference between cells.

In general, NAND memories of the generation with advanced miniaturization in recent years adopt a technique of simultaneously writing (programming) all the bits to be stored in one memory cell, in order to prevent mutual interference between cells.

On the other hand, if mutual interference between cells is not so serious, the bits to be stored in one memory cell may be programmed one by one in order. As a method of programming bits one by one for memory cells of the 3-bit/Cell type, there is known 1-2-4 coding. This method is such coding that seven portions between eight threshold voltage regions of the 3-bit/Cell type are allocated to the three bits respectively by 1, 2, and 4 portions.

BRIEF DESCRIPTION OF THE DRAWINGS

FIGS. 11A and 11B are views showing data coding according to a second embodiment;

FIGS. 17A to 17C are views showing data coding according to a third embodiment;

FIGS. 19A to 19C are views showing data coding according to a fourth embodiment;

FIGS. 21A to 21C are views showing data coding according to a fifth embodiment;

FIGS. 23A to 23C are views showing data coding according to a sixth embodiment;

DETAILED DESCRIPTION

According to one embodiment, a nonvolatile memory includes memory cells each configured to store three bits respectively corresponding to first to third pages. In writing of the first page, a threshold voltage of the memory cell is set to fall within a first or second threshold region in accordance with a bit value to be written to the first page. In writing of the second page, if being within the first threshold region, it is set to fall within the first or fourth threshold region in accordance with a bit value to be written; and if being within the second threshold region, it is set to fall within the second or third threshold region in accordance with a bit value to be written. In writing of the third page, if being within the first threshold region, it is set to fall within the first or sixth threshold region in accordance with a bit value to be written; if being within the second threshold region, it is set to fail within the second or seventh threshold region in accordance with a bit value to be written; if being within the third threshold region, it is set to fall within the third or eighth threshold region in accordance with a bit value to be written; and being within the fourth threshold region, it is set to fall within the fourth or fifth threshold region in accordance with a bit value to be written.

Exemplary embodiments of a nonvolatile memory and writing method will be explained below in detail with reference to the accompanying drawings. The present invention is not limited to the following embodiments.

First Embodiment

Figure 1:
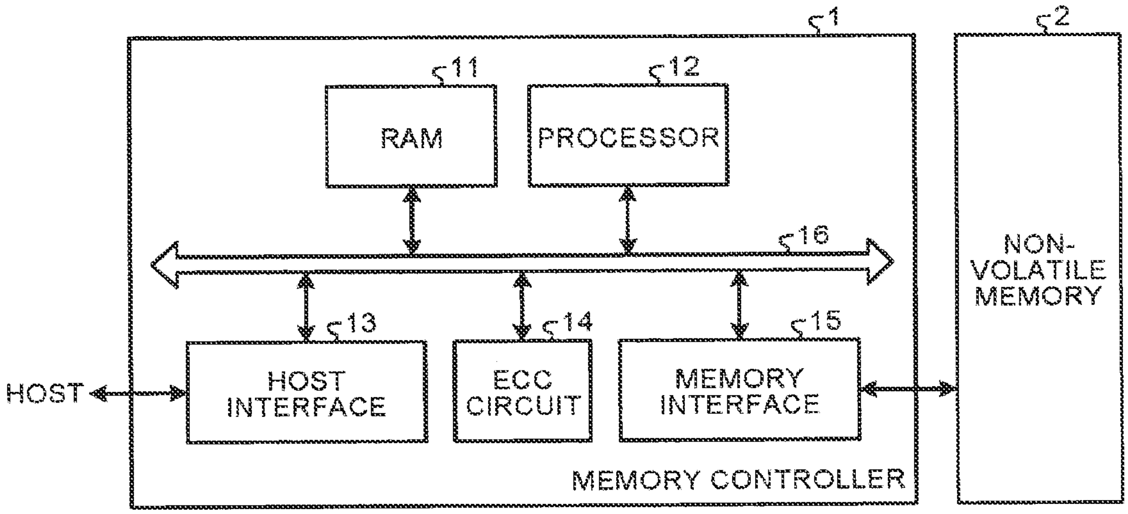
FIG. 1 is a block diagram showing a configuration example of a memory device according to a first embodiment.

FIG. 1 is a block diagram showing a configuration example of a memory device according to a first embodiment. The memory device according to this embodiment is equipped with a memory controller 1 and a nonvolatile memory 2. The memory device can be connected to a host. For example, the host is an electronic apparatus, such as a personal computer or mobile terminal.

The nonvolatile memory 2 is a memory that stores data in a nonvolatile manner, such as a NAND memory. In this embodiment, the nonvolatile memory 2 will be explained as a NAND memory including memory cells that are capable of storing three bits in each memory cell, i.e., a NAND memory of the 3-bit/Cell type.

The memory controller 1 controls writing of the nonvolatile memory 2, in accordance with a write command from the host. Further, the memory controller 1 controls reading of the nonvolatile memory 2, in accordance with a read command from the host. The memory controller 1 is equipped with a RAM 11, a processor 12, a host interface 13, an FCC circuit 14, and a memory interface 15. The RAM (Random Access Memory) 11, the processor 12, the host interface 13, the FCC circuit 14, and the memory interface 15 are connected to each other via an internal bus 16.

The host interface 13 outputs commands, user data (write data), and so forth, which have been received from the host, to the internal bus 16. Further, the host interface 13 transmits user data lead from the nonvolatile memory 2, responses from the processor 12, and so forth to the host.

Based on instructions from the processor 12, the memory interface 15 controls a writing process of user data or the like performed to the nonvolatile memory 2 and a reading process performed to the nonvolatile memory 2.

The processor 12 totally controls the memory controller 1. For example, the processor 12 is a CPU (Central Processing Unit), MPU (Micro Processing Unit), or the like. When the processor 12 receives a command from the host via the host interface 13, it performs control according to this command. For example, in accordance with a command from the host, the processor 12 instructs the memory interface 15 to write user data and parity to the nonvolatile memory 2. Further, in accordance with a command from the host, the processor 12 instructs the memory interface 15 to read user data and parity from the nonvolatile memory 2.

The processor 12 determines a storage region (memory region) on the nonvolatile memory 2, for user data to be stored in the RAM 11. The user data is stored into the RAM 11 via the internal bus 16. The processor 12 performs the decision of a memory region, in accordance with data (page data) of a page size, which is the write unit. In this specification, user data to be stored in one page of the nonvolatile memory 2 is defined as unit data. In general, the unit data is encoded and is stored as a code ward in the nonvolatile memory 2. In this embodiment, encoding is not essential, and so the unit data may be stored in a non-encoded state in the nonvolatile memory 2. However, FIG. 1 shows a configuration that performs encoding, as a configuration example. If encoding is not performed, the page data coincides with the unit data. Further, one code ward may be generated based on single unit data, or one code ward may be generated based on division data derived by dividing the unit data. Further, one code ward may be generated by use of a plurality of pieces of unit data.

The processor 12 determines writing-destination memory regions of the nonvolatile memory 2 for respective unit data. Physical addresses are respectively assigned to memory regions of the nonvolatile memory 2. The processor 12 manages the writing-destination memory regions for unit data by use of the physical addresses. The processor 12 designates a determined memory region (physical address) and instructs the memory interface 15 to write user data to the nonvolatile memory 2. The processor 12 manages the correspondence relationship between logical addresses (logical addresses managed by the host) and physical addresses, for user data. When the processor 12 receives a read command including a logical address from the host, it specifies a physical address corresponding to the logical address and instructs the memory interface 15 to read user data by designating the physical address.

In this specification, the memory cells connected to one word line in common are defined as a memory cell group. In this embodiment, the nonvolatile memory 2 is a NAND memory of the 3-bit/Cell type, and one memory cell group corresponds to three pages. The three bits of the memory cells respectively correspond to these three pages. In this embodiment, these three pages will be referred to as a Lower page (first page), a Middle page (second page), and an Upper page (third page).

The FCC circuit 14 encodes user data stored in the RAM 11 and thereby generates code wards. Further, the FCC circuit 14 decodes code wards read from the nonvolatile memory 2.

The RAM 11 temporarily stores user data received from the host until it is stored in the nonvolatile memory 2, and temporarily stores data read from the nonvolatile memory 2 until it is transmitted to the host. For example, the RAM 11 is a multi-purpose memory, such as an SRAM (Static Random Access Memory) or DRAM (Dynamic Random Access Memory).

FIG. 1 shows a configuration example in which the memory controller includes both of the ECC circuit 14 and the memory interface 15. However, the FCC circuit 14 may be built in the memory interface 15. Further, the FCC circuit 14 may be built in the nonvolatile memory 2.

Figure 2:
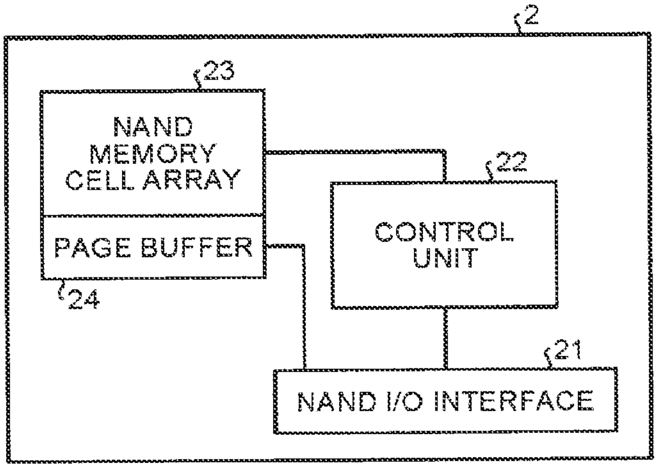
FIG. 2 is a block diagram showing a configuration example of a nonvolatile memory according to the first embodiment.

FIG. 2 is a block diagram showing a configuration example of the nonvolatile memory 2 according to this embodiment. The nonvolatile memory 2 is equipped with a NAND I/O Interface 21, a control unit 22, a NAND memory cell array (memory cell part) 23, and a page buffer 24. For example, the nonvolatile memory 2 is formed of a one-chip semiconductor substrate (such as silicon substrate).

The control unit 22 controls operations of the nonvolatile memory 2 based on commands or the like input from the memory controller 1 via the NAND I/O Interface 21. Specifically, when a writing request is input, the control unit 22 performs control to write data associated with this writing request to a designated address on the NAND memory cell array 23. Further, when a reading request is input, the control unit 22 performs control to read data associated with this reading request from the NAND memory cell array 23 and to output it to the memory controller 1 via the NAND I/O Interface 21. The page buffer 24 is buffer configured to temporarily store data input from the memory controller 1 in writing of the NAND memory cell array 23 and to temporarily stores data read from the NAND memory cell array 23.

Figures 3, 4:
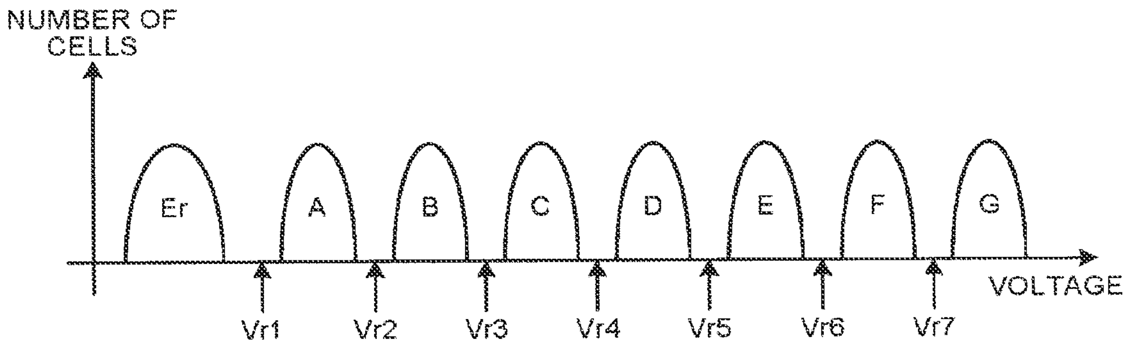
FIG. 3 is a view showing an example of threshold regions according to the first embodiment.
FIG. 4 is a view showing data coding according to the first embodiment.

FIG. 3 is a view showing an example of threshold regions according to this embodiment. NAND memories are configured to store information based on charge amounts respectively stored in the floating gates of memory cells. Each of the memory cells has a threshold voltage in accordance with its charge amount. A plurality of data values to be stored in the memory cells are respectively correlated with a plurality of regions of threshold voltage (threshold regions). The eight distributions (mountain shapes) indicated by Er, A, B, C, D, E, F, and G in FIG. 3 respectively show threshold distributions within eight threshold regions. In FIG. 3, the horizontal axis denotes the threshold voltage, and the vertical axis denotes the distribution of the number of memory cells (the number of cells). In this embodiment, a region where the threshold voltage is not higher than Vr1 is called region Er, a region where the threshold voltage is higher than Vr1 but not higher than Vr2 is called region A, a region where the threshold voltage is higher than Vr2 but not higher than Vr3 is called region B, a region where the threshold voltage is higher than Vr3 but not higher than Vr4 is called region C, a region where the threshold voltage is higher than Vr4 but not higher than Vr5 is called region D, a region where the threshold voltage is higher than Vr5 but not higher than Vr6 is called region E, a region where the threshold voltage is higher than Vr6 but not higher than Vr7 is called region F, and a region where the threshold voltage is higher than Vr7 is called region G. Further, the threshold distributions corresponding to the regions Er, A, B, C, D, E, F, and G are respectively called distributions Er, A, B, C, D, E, F, and G (first to eighth distributions). The above-mentioned Vr1 to Vr7 are threshold voltages serving as boundaries between the respective regions.

In NAND memories, a plurality of data values are respectively correlated with a plurality of threshold regions of the memory cells (i.e., threshold distributions). This correlation is called data coding. This data coding is determined in advance, and, in data writing (programming), electric charges are injected to the memory cells in accordance with the data coding so that they come into respective threshold regions corresponding to data values to be stored. Then, in reading, a read voltage is applied to the memory cells, and data is determined in accordance with whether the thresholds of the memory cells are lower or higher than the read voltage. When the threshold voltage is lower than the read voltage, it represents an "erased" state and the data value is defined as "1". When the threshold voltage is not lower than the read voltage, it represents a "programmed" state and the In value is defined as "0".

FIG. 4 is a view showing data coding according to this embodiment. In this embodiment, the eight threshold distributions (threshold regions) shown in FIG. 3 are respectively correlated with eight data values of three bits. As shown in FIG. 4, a memory cell whose threshold voltage is within the region Er is in a state storing "111" as a data value of bits corresponding to the Upper, Middle, and Lower pages. A memory cell whose threshold voltage is within the region A is in a state storing "110". A memory cell whose threshold voltage is within the region B is a state storing "100". A memory cell whose threshold voltage is within the region C is in a state storing "101". A memory cell whose threshold voltage is within the region D is in a state storing "001". A memory cell whose threshold voltage is within the region F is in a state storing "011". A memory cell whose threshold voltage is within the region F is in a state storing "010". A memory cell whose threshold voltage is within the region C is in a state storing "000". When a memory cell is in an unwritten state ("erased" state), the threshold voltage of the memory cell is within the region Er. As described above, the coding shown in FIG. 4 is gray coding in which the data changes only with one bit between arbitrary two regions adjacent to each other.

In the coding shown in FIG. 4 according to this embodiment, a threshold voltage serving as the boundary for judging the bit value of the Upper page is Vr4. Threshold voltages serving as the boundaries for judging the bit value of the Middle page are Vr2, Vr5, and Vr7. Threshold voltages serving as the boundaries for judging the bit value of the Lower page are Vr1, Vr3, and Vr6. The numbers of threshold voltages serving as the boundaries for judging the bit value (which will be referred to as a boundary number, hereinafter) are 1, 3, and 3 respectively for the Upper page, the Middle page, and the Lower page. Hereinafter, this coding will be referred to as 1-3-3 coding, named after the respective boundary numbers for the Upper page, the Middle page, and the Lower page. It should be noted here that the number of boundaries by which each page can change from the adjacent data is three at most. Based on the coding shown in FIG. 4, the control unit 22 of the nonvolatile memory 2 controls programming of the NAND memory cell array 23 and reading of the NAND memory cell array 23.

As a programming method of a NAND memory of the 3-bit/Cell type, there is known a method of simultaneously writing data of the three pages to be stored in one memory cell group. However, this method does not allow writing of data to be performed to the pages one by one, but allows writing to be performed only after data of the three pages is all prepared. In order to efficiently perform writing, it is preferable if writing can be performed to each of the pages. As an example that performs programming of the pages one by one in order, there is known 1-2-4 coding in which the boundary numbers are 1, 2, and 4 respectively for the Upper page, the Middle page, and the Lower page. According to this method, the maximum boundary number is four, and so the probability of error generation becomes higher at the page with the largest boundary number. The error correction capability used in encoding user data is implemented to handle the page with the highest error generation probability. Accordingly, this method entails increases in the cost and/or power consumption of the memory device to enhance the error correction capability, along with decreases in the writing and reading rates. Thus, it is preferable for the pages to have error generation probabilities not so different between them as possible.

In this embodiment, writing can be performed to the pages one by one, as described later. In addition to that, as described above, it adopts the 1-3-3 coding whose deviations in boundary number between the pages are smaller. Consequently, as compared with the 1-2-4 coding, it can provide decreases in the cost and/or power consumption of the memory device, along with increases in the writing and reading rates. Further, as described later, without managing information about how many pages writing has been performed to, a correct read result can be obtained, in reading of any one of the Upper page, the Middle page, and the Lower page.

Figures 5A, 5B, 5C:
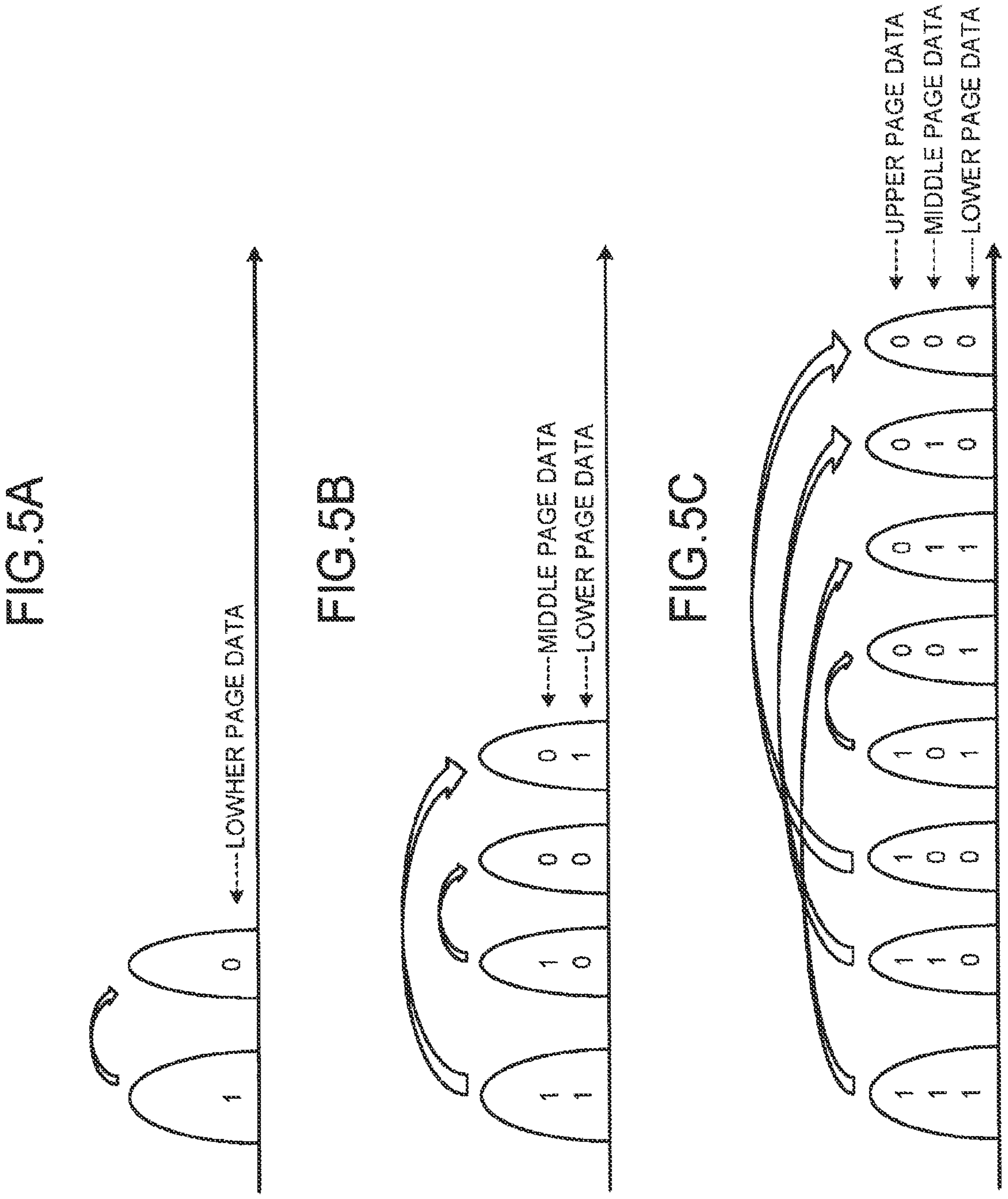
FIGS. 5A to 5C are views showing threshold distributions after programming of memory cells according to the first embodiment.

FIGS. 5A to 5C are views showing threshold distributions after programming of memory cells according to this embodiment. FIG. 5A shows threshold distributions after programming of the Lower page, FIG. 5B shows threshold distributions after programming of the Middle page, and FIG. 5C shows threshold distributions after programming of the Upper page. In this embodiment, programming can be performed for the pages one by one, but the order of programming is fixed such that writing is performed to the Lower page, the Middle page, and the Upper page in this order. However, it is not necessary to consecutively perform writing to the Lower page, the Middle page, and the Upper page of one memory cell group. For example, a writing sequence may be set up such that it first performs writing of the Lower page of a first memory cell group, then it performs writing of the Lower page of a second memory cell group, and the it performs writing of the Middle pace of the first memory cell group.

When the memory cells of the NAND memory cell array 23 are in the unwritten state ("erased" state), they are all in the distribution Er state. As shown in FIG. 5A, in programming of the Lower page, the control unit 22 of the nonvolatile memory 2 operates in accordance with the bit value to be written (to be stored) to the Lower page, and sets each of the memory cells to be kept in the distribution Er or to be shifted upward by one level to the distribution A by injecting an electric charge. Specifically, the control unit 22 performs programming such that, when the bit value to be written to the Lower page is "1", no electric charge is injected, and, when the bit value to be written to the Lower page is "0", an electric charge is injected to shift the threshold voltage to the distribution A.

As shown in FIG. 5B, in writing of a memory cell group whose Lower page has already been subjected to writing, the control unit 22 performs programming of the Middle page. Specifically, if a memory cell is in the distribution Er state due to the programming of the Lower page, the control unit 22 perform programming such that, when the bit value to be written to the Middle page is "1", the memory cell is kept in the distribution Er, and, when the bit value to be written to the Middle page is "0", it is shifted to the distribution C. Further, if a memory cell is in the distribution A state due to the programming of the Lower page, the control unit 22 performs programming such that, when the bit value to be written to the Middle page is "1", the memory cell is kept in the distribution A, and, when the bit value to be written to the Middle page is "0", it is shifted to the distribution B.

As shown in FIG. 5C, in writing of a memory cell group whose Middle page has already been subjected to writing, the control unit 22 performs programming of the Upper page. Specifically, if a memory cell is in the distribution Er state due to the programming of the Middle page, the control unit 22 performs programming such that, when the bit value to be written to the Upper page is "1", the memory cell is kept in the distribution Er, and, when the bit value to be written to the Upper page is "0", it is shifted to the distribution E. Further, if a memory cell is in the distribution A state due to the programming of the Middle page, the control unit 22 performs programming such that, when the bit value to be written to the Upper page is "1", the memory cell is kept in the distribution A, and, when the bit value to be written to the Upper page is "0", it is shifted to the distribution F. Further, if a memory cell is in the distribution B state due to the programming of the Middle page, the control unit 22 performs programming such that, when the bit value to be written to the Upper page is "1", the memory cell is kept in the distribution B, and, when the bit value to be written to the Upper page is "0", it is shifted to the distribution G. Further, if a memory cell is in the distribution C state due to the programming of the Middle page, the control unit 22 performs programming such that, when the bit value to be written to the Upper page is "1", the memory cell is kept in the distribution C, and, when the bit value to be written to the Upper page is "0", it is shifted to the distribution D.

As described above, according to this embodiment, the control unit 22 performs programming of any of the pages such that, when the bit value to be written is "1", no electric charge is injected, and, when the bit value to be written is "0", an electric charge is injected to shift the distribution to a distribution having a higher threshold voltage than that of before the programming.

Typically, the programming is performed by applying a programming voltage pulse one or more times. Every time the programming voltage pulse is applied, reading is subsequently performed to confirm if the cell has been shifted by exceeding the threshold boundary level. This is repeated to shift the threshold of the memory cell into the range of a predetermined threshold distribution (threshold region). The specific sequence of the programming is not limited to this example.

Figure 6:
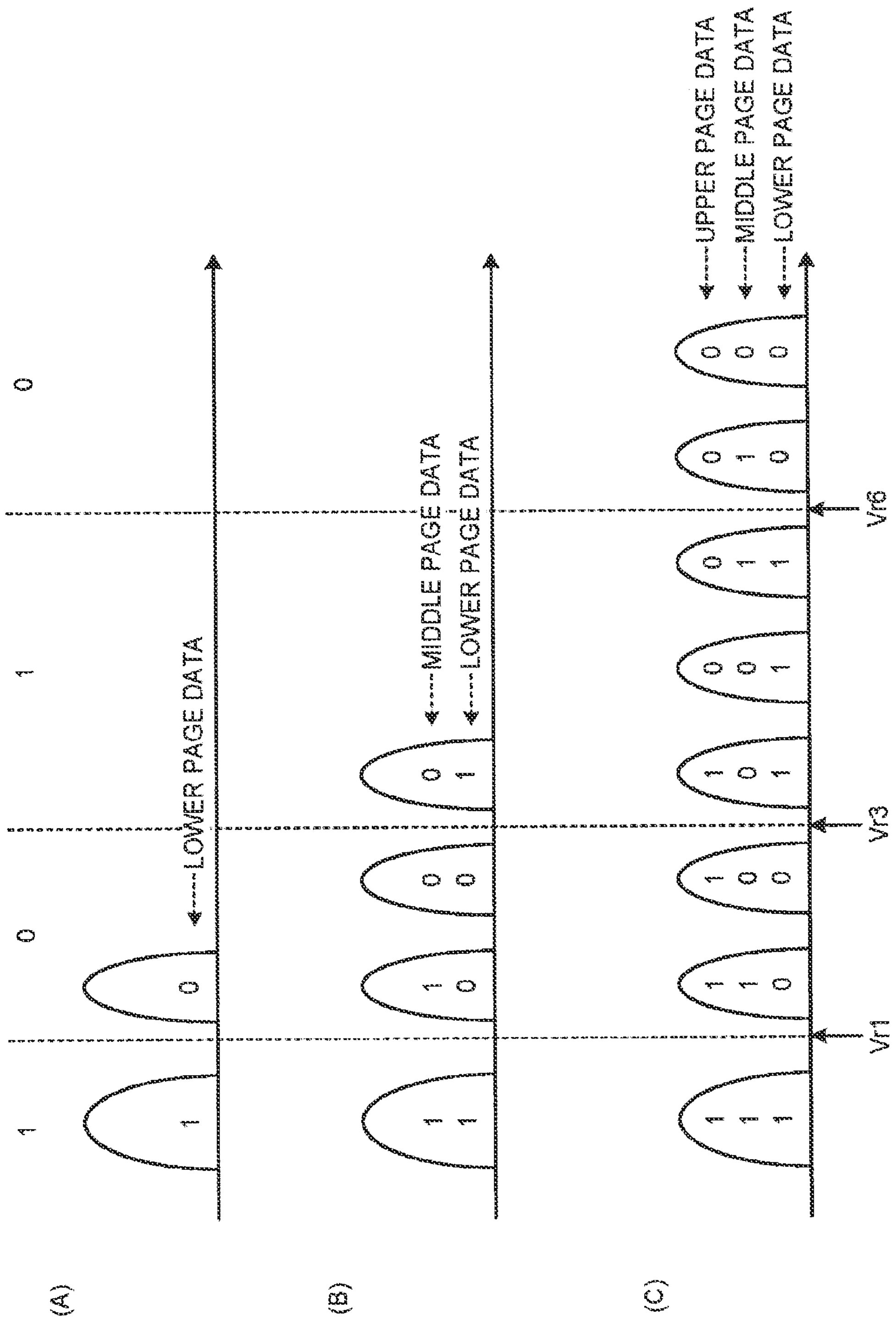
FIG. 6 is a view showing a method of reading a Lower page according to the first embodiment.

Next, an explanation will be given of reading according to this embodiment. FIG. 6 is a view showing a method of reading the Lower page according to this embodiment. In this embodiment, regardless of how many pages writing has been performed to, the bit value of the Lower page can be read by applying three voltages Vr1, Vr3, and Vr6 as read voltages.

In FIG. 6, (A) shows a state where the Lower page has been subjected to writing while the Middle page and the Upper page have not yet been subjected to writing, by a programming method according to this embodiment, as shown in FIG. 5A. When the three voltages Vr1, Vr3, and Vr6 are applied as read voltages in this state, a memory cell storing a bit value "1" is judged as having a threshold voltage lower than Vr1, and so the read result of the bit value of the Lower page comes to "1". On the other hand, a memory cell storing a bit value "0" is judged as having a threshold voltage not lower than Vr1 but lower than Vr3, and so the read result of the bit value of the Lower page comes to "0".

In FIG. 6, (B) shows a state where the Middle page has been subjected to writing while the Upper page has not yet been subjected to writing, by a programming method according to this embodiment, as shown in FIG. 5B. When the three voltages Vr1, Vr3, and Vr6 are applied as read voltages in this state, a memory cell storing a bit value "11" is judged as having a threshold voltage lower than Vr1, and so the read result of the bit value of the Lower page comes to "1". A memory cell storing a bit value "10" and a memory cell storing a bit value "00" are judged as having a threshold voltage not lower than Vr1 but lower than Vr3, and so the read result of the bit value of the tower page comes to "0". A memory cell storing a bit value "01" is judged as having a threshold voltage not lower than Vr3 but lower than Vr6, and so the read result of the bit value of the Lower page comes to "1".

In FIG. 6, (C) shows a state where the Upper page has been subjected to writing, by a programming method according to this embodiment, as shown in FIG. 5C. When the three voltages Vr1, Vr3, and Vr6 are applied as read voltages in this state, a memory cell storing a bit value "111" is judged as having a threshold voltage lower than Vr1, and so the read result of the bit value of the Lower page comes to "1". A memory cell storing a bit value "110" and a memory cell storing a bit value "100" are judged as having a threshold voltage not lower than Vr1 but lower than Vr3, and so the read result of the bit value of the Lower page comes to "0". A memory cell storing a bit value "101", a memory cell storing a bit value "001", and a memory cell storing a bit value "001" are judged as having a threshold voltage not lower than Vr3 but lower than Vr6, and so the read result of the bit value of the tower page comes to "1". A memory cell storing a bit value "010" and a memory cell storing a bit value "000" are judged as having a threshold voltage not lower than Vr6, and so the read result of the bit value of the tower page comes to "0".

As described above, regardless of how many pages writing has been performed to, the bit value of the Lower page can be correctly read by applying the three voltages Vr1, Vr3, and Vr6 as read voltages.

Figure 7:
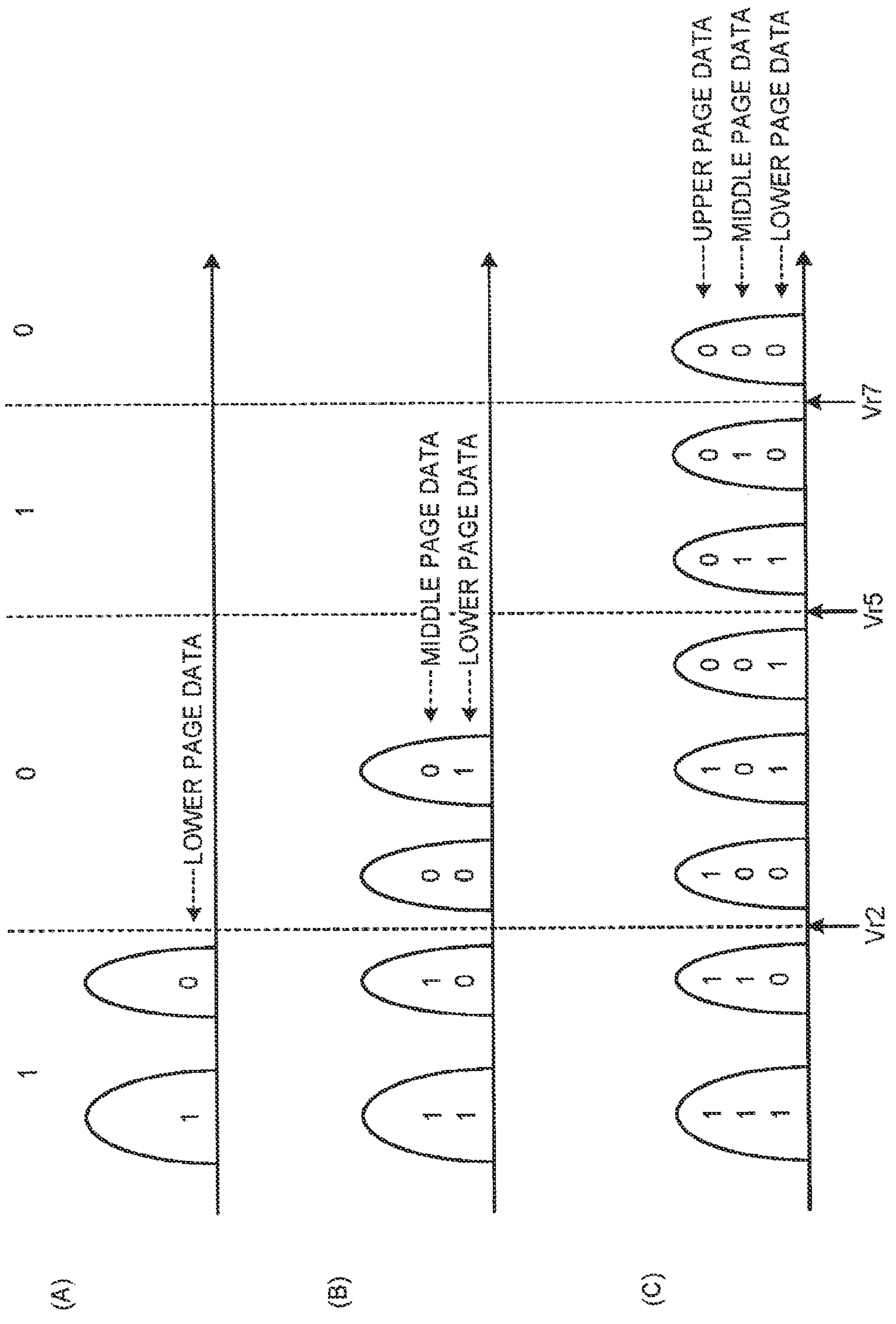
FIG. 7 is a view showing a method of reading a Middle page according to the first embodiment.

FIG. 7 is a view showing a method of reading the Middle page according to this embodiment. In this embodiment, regardless of how many pages writing has been performed to, the bit value of the Middle page can be read by applying three voltages Vr2, Vr5, and Vr7 as read voltages.

In FIG. 7, (A) shows a state where the Lower page has been subjected to writing while the Middle page and the Upper page have not yet been subjected to writing, by a programming method according to this embodiment, as shown in FIG. 5A. When the three voltages Vr2, Vr5, and Vr7 are applied as read voltages in this state, a memory cell storing a bit value "1" and a memory cell storing a bit value "0" are judged as having a threshold voltage lower than Vr2, and so the read result of the bit value of the Middle page comes to "1". In this state, since the Middle page has not yet been subjected to writing, "1" representing the unwritten state is the correct value as the bit value of the Middle page.

In FIG. 7, (B) shows a state where the Middle page has been subjected to writing while the Upper page has not yet been subjected to writing, by a programming method according to this embodiment, as shown in FIG. 5B. When the three voltages Vr2, Vr5, and Vr7 are applied as read voltages in this state, a memory cell storing a bit value "11" and a memory cell storing a bit value "10" are judged as having a threshold voltage lower than Vr2, and so the read result of the bit value of the Middle page comes to "1". A memory cell storing a bit value "00" and a memory cell storing a bit value "01" are judged as having a threshold voltage not lower than Vr2 but lower than Vr5, and so the read result of the bit value of the Middle page comes to "0".

in FIG. 7, (C) shows a state where the Upper page has been subjected to writing, by a programming method according to this embodiment, as shown in FIG. 5C. When the three voltages Vr2, Vr5, and Vr7 are applied as read voltages in this state, a memory cell storing a bit value "111" and a memory cell storing a bit value "110" are judged as having a threshold voltage lower than Vr2, and so the read result of the bit value of the Middle page comes to "1", A memory cell storing a bit value "100", a memory cell storing a bit value "101", and a memory cell storing a bit value "001" are judged as having a threshold voltage not lower than Vr2 but lower than Vr5, and so the read result of the bit value of the Middle page comes to "0". A memory cell storing a bit value "011" and a memory cell storing a bit value "010" are judged as having a threshold voltage not lower than Vr5 but lower than Vr7, and so the read result of the bit value of the Middle page comes to "1". A memory cell storing a bit value "000" is judged as having a threshold voltage not lower than Vr7, and so the read result of the bit value of the Middle page comes to "0".

As described above, regardless of how many pages writing has been performed to, the bit value of the Middle page can be correctly read by applying the three voltages Vr2, Vr5, and Vr7 as read voltages.

Figure 8:
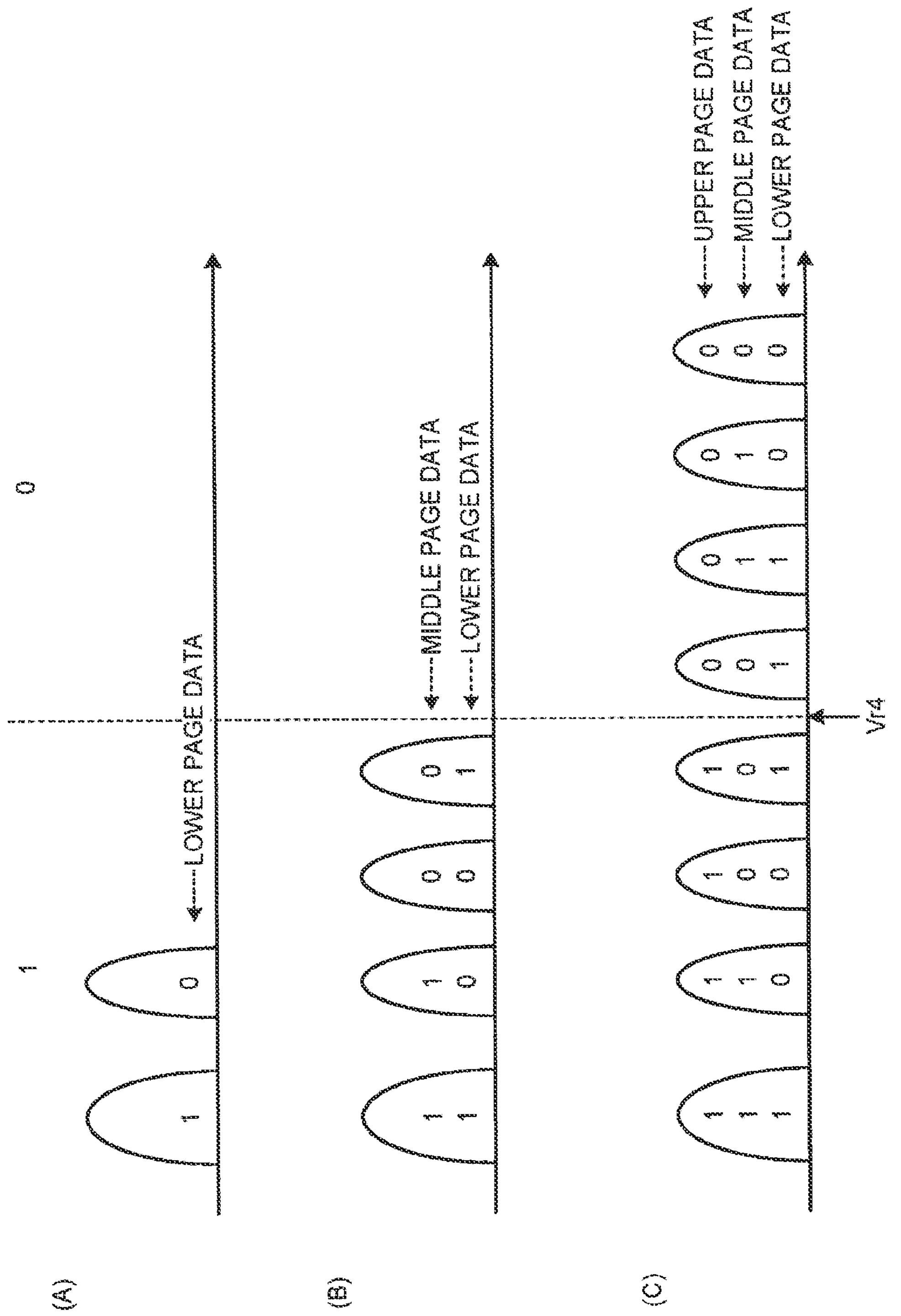
FIG. 8 is a view showing a method of reading an Upper page according to the first embodiment.

FIG. 8 is a view showing a method of reading the Upper page according to this embodiment. In this embodiment, regardless of how many pages writing has been performed to, the bit value of the Upper page can be read by applying Vr4 as a read voltage.

In FIG. 8, (A) shows a state where the Lower page has been subjected to writing while the Middle page and the Upper page have not yet been subjected to writing, by a programming method according to this embodiment, as shown in FIG. 5A. When Vr4 is applied as a read voltage an this state, a memory cell storing a bit value "1" and a memory cell storing a bit value "0" are judged as having a threshold voltage lower than Vr4, and so the read result of the bit value of the Upper page comes to "1", In this state, since the Upper page has not yet been subjected to writing, "1" representing the unwritten state is the correct value as the bit value of the Upper page.

In FIG. 8, (B) shows a state where the Middle page has been subjected to writing while the Upper page has not yet been subjected to writing, by a programming method according to this embodiment, as shown in FIG. 5B. When Vr4 is applied as a read voltage in this state, a memory cell storing a bit value "11", a memory cell storing a bit value "10", a memory cell storing a bit value "00" and a memory cell storing a bit value "01" are judged as having a threshold voltage lower than Vr4, and so the read result of the bit value of the Upper page comes to "1". In this state, since the Upper page has not yet been subjected to writing, "1" representing the unwritten state is the correct value as the bit value of the Upper page.

In FIG. 8, (C) shows a state where the Upper page has been subjected to writing, by a programming method according to this embodiment, as shown in FIG. 5C. When Vr4 is applied as a read voltage in this state, a memory cell storing a bit value "111", a memory cell storing a bit value "110", a memory cell storing a bit value "100", and a memory cell storing a bit value "101" are judged as having a threshold voltage lower than Vr4, and so the read result of the bit value of the Upper page comes to "1". A memory cell storing a bit value "001", a memory cell storing a bit value "011", a memory cell storing a bit value "010", and a memory cell storing a bit value "000" are judged as having a threshold voltage not lower than Vr4, and so the read result of the bit value of the Upper page comes to "0".

As described above, regardless of how many pages writing has been performed to, the bit value of the Upper page can be correctly read by applying Vr4 as a read voltage. In this way, the bit value of each of the pages can be correctly read regardless of how many pages writing has been performed to, and so there is no need for this embodiment to manage information about how many pages writing has been performed to.

Figure 9:
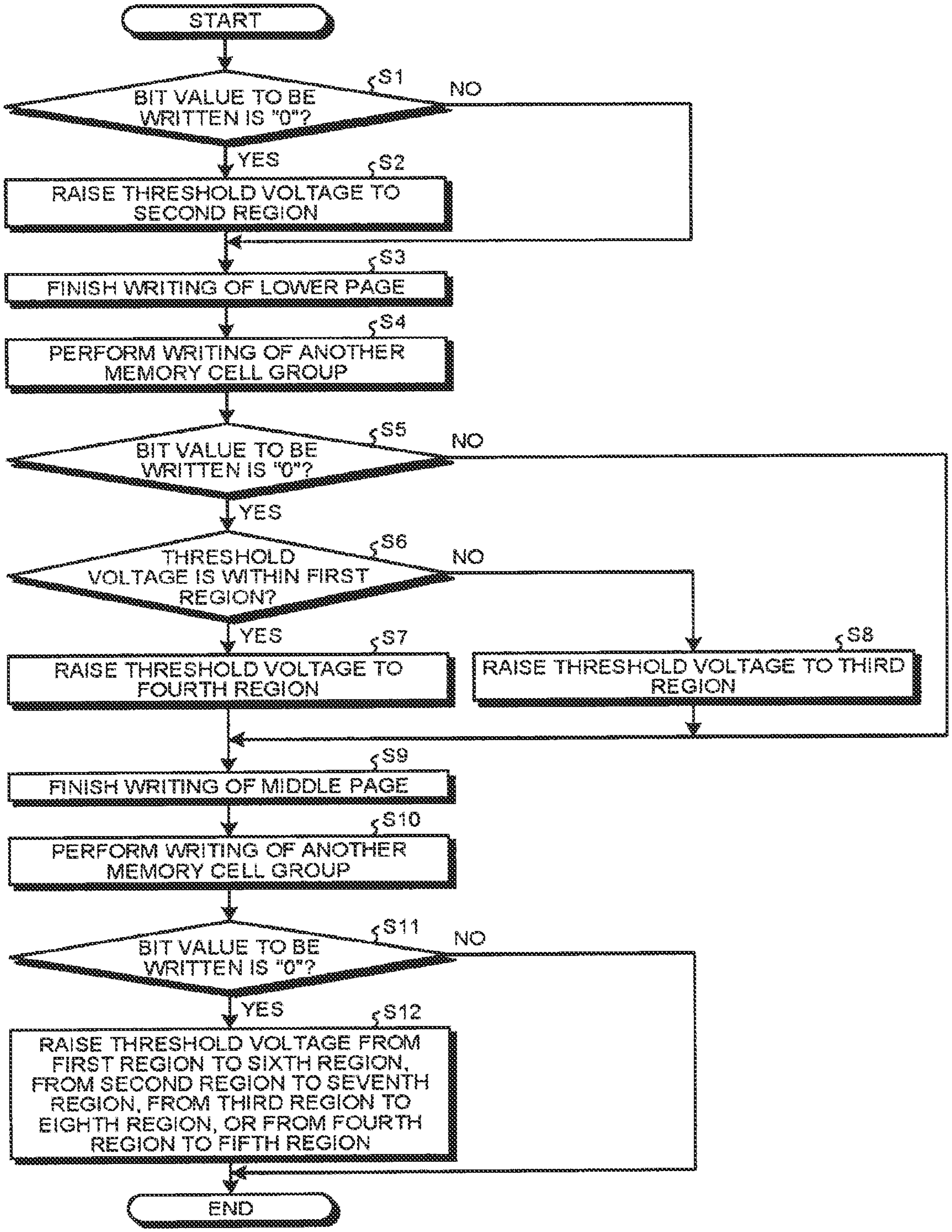
FIG. 9 is a flow chart showing an example of a writing sequence according to the first embodiment.

FIG. 9 is a flow chart showing an example of a writing sequence according to this embodiment. FIG. 9 shows an example of a sequence about one memory cell group, from the unwritten state to the end of writing of the Upper page. At first, before writing, the control unit 22 makes a judgment of whether or not the bit value to be written is "0", for each of the memory cells (step S1). For a memory cell where the bit value to be written is "0" (Yes from step S1), the control unit 22 injects an electric charge to raise its threshold voltage from the distribution Er (first region) to the distribution A (second region) (step S2). For a memory cell where the bit value to be written is not "0" (i.e., it is "1") (No from step S1), the control unit 22 does not change its threshold voltage.

After the control unit 22 performs the above-described steps S1 and S2 for all the memory cells of the memory cell group, it finishes the writing of the Lower page (step S3), and then performs writing of another memory cell group (step S4). However, it may proceed to the next step S5 without performing writing of another memory cell group.

When the control unit 22 performs writing of the same memory cell group after finishing the writing of the Lower page, it makes a judgment of whether or not the bit value to be written is "0", for each of the memory cells (step S5). For a memory cell where the bit value to be written is "0" (Yes from step S5), the control unit 22 makes a judgment of whether or not the threshold voltage of this memory cell is within the distribution Er (step S6). If the threshold voltage of the memory cell is within the distribution Er (Yes from step S6), the control unit 22 injects an electric charge to raise its threshold voltage from the distribution Er to the distribution C (fourth region) (step S7). If the threshold voltage of this memory cell is not within the distribution Er (No from step S6), the control unit 22 injects an electric charge to raise its threshold voltage from the distribution A to the distribution B (third region) (step S8). For a memory cell where the bit value to be written is not "0" (i.e., it is "1") (No from step S5), the control unit 22 does not change its threshold voltage.

After the control unit 22 performs the above-described steps S5 to S8 for all the memory cells of the memory cell group, it finishes the writing of the Middle page (step S9), and then performs writing of another memory cell group (step S10). However, it may proceed to the next step S11 without performing writing of another memory cell group.

When the control unit 22 performs writing of the same memory cell group after finishing the writing of the Middle page, it makes a judgment of whether or not the bit value to be written is "0", for each of the memory cells (step S11). For a memory cell where the bit value to be written is "0" (Yes from step S11), the control unit 22 injects an electric charge into this memory cell to raise its threshold voltage (step S12). Specifically, a memory cell having the distribution Fr is shifted to the distribution F (sixth region), a memory cell having the distribution A is shifted to the distribution F (seventh region), a memory cell having the distribution B is shifted to the distribution G (eighth region), and a memory cell having the distribution C is shifted to the distribution C (fifth region). For a memory cell where the bit value to be written is not "0" (No from step S11), the control unit 22 ends the process as it is. By doing the process described above, the control unit 22 completes the writing of the pages up to the Upper page.

Figure 10:
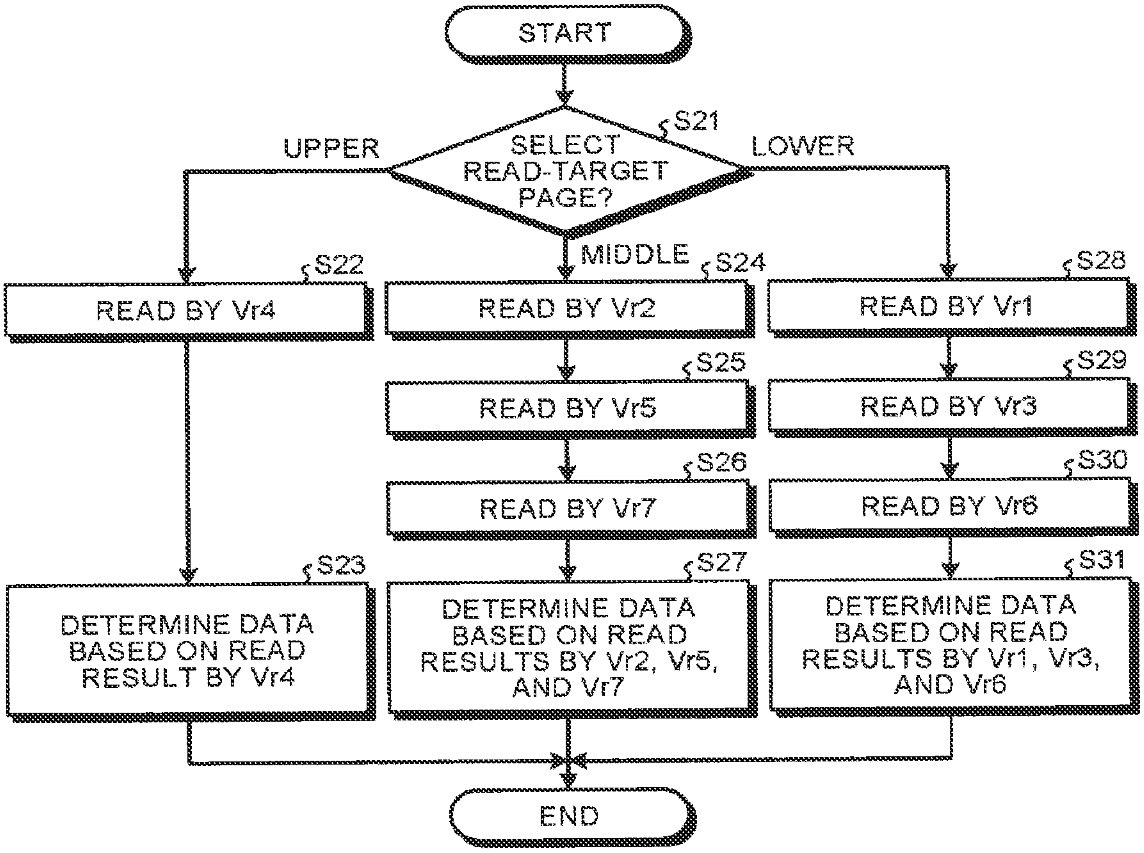
FIG. 10 is a flow chart showing an example of a reading sequence according to the first embodiment.

FIG. 10 is a flow chart showing an example of a reading sequence according to this embodiment. As described above, in this embodiment, regardless of how many pages, of the Upper, Middle, and Lower pages, writing has been performed to, reading can be performed. At first, the control unit 22 selects a read-target page from the Upper, Middle, and tower pages (step S21). When selecting the Upper page (Upper from step S21), the control unit 22 performs reading by use of Vr4 (step S22). The control unit 22 determines the data (the bit value of each of the memory cells) based on the read result obtained by Vr4 (step S23), and ends the process.

When selecting the Middle page (Middle from step S21), the control unit 22 performs reading by use of Vr2 (step S24). Then, the control unit 22 performs reading by use of Vr5 (step S25). Then, the control unit 22 performs reading by use of Vr7 (step S26). The control unit 22 determines the data based on the read results obtained by Vr2, Vr5, and Vr7 (step S27), ad ends the process.

When selecting the Lower page (Lower from step S21), the control unit 22 performs reading by use of Vr1 (step S28). Then, the control unit 22 performs reading by use of Vr3 (step S29). Then, the control unit 22 performs reading by use of Vr6 (step S30). The control unit 22 determines the data based on the read results obtained by Vr1, Vr3, and Vr6 (step S31), and ends the process.

As described above, in this embodiment, the 1-3-3 coding shown in FIG. 4 is used to perform writing of the pages one by one. Accordingly, this embodiment can reduce the deviations in boundary number between the pages, and can smooth the error generation probabilities between the pages, and it can further provide decreases in the cost and/or power consumption of the memory device, along with increases in the writing and reading rates. Further, this embodiment allows the Upper page, the Middle page, and the Lower page to be respectively read by use of the same sequence, regardless of how many pages writing has been performed to, and so there is no need to manage information about how many pages writing has been performed to.

Second Embodiment

FIGS. 11A and 11B are views showing data coding according to a second embodiment. This embodiment employs a memory device and a nonvolatile memory 2 that have the same configurations as those of the first embodiment. Hereinafter in this embodiment, an explanation will be given of differences from the first embodiment.

FIG. 11A shows data coding for writing of the Lower page, and FIG. 11B shows data coding for writing of the Middle page and data coding for writing of the Upper page. As shown in FIGS. 11A and 11B. The writing of the Upper page and the writing of the Middle page use the same data coding (FIG. 11B), but the writing of the Lower page uses data coding different from that for the Upper page and the Middle page (FIG. 11A)

As described above, in this embodiment, the data coding differs depending on the page, but writing can be performed to the pages one by one in order, by managing information about how many pages writing has been performed to. The boundary numbers of the respective pages according to this embodiment are the same as those of the first embodiment referred to as 1-3-3, which can smooth the error generation probabilities between the pages.

In this embodiment, the control unit 22 utilizes a write page flag (write page information) to manage information about how many pages, of the Upper page, the Middle page, and the Lower page, writing has been performed to, for each memory cell group.

Comparing the data coding shown in FIG. 11B with the data coding shown in FIG. 11A, the data coding shown in FIG. 11A includes a change at the bit value corresponding to the distribution B of the Middle page. The data coding shown in FIG. 11A is data coding for writing of the Lower page, and so the Middle page and the Upper page have not yet been subjected to writing, at this time. In FIG. 11A, there is a threshold distribution provided with hatching as a nonexistent threshold distribution to indicate that this distribution is not used in writing of the Lower page. In the first embodiment, threshold distributions not used in writing of the Lower page are consecutive regions not lower than the distribution B. On the other hand, in this embodiment, in addition to consecutive regions not lower than the distribution C, the distribution A not used exists between the distribution Er and the distribution B both used in writing of the Lower page. Consequently, in reading of the unwritten Middle page after writing of the Lower page, it is necessary to perform the reading by use of data allocation different from data allocation used after writing of the Middle page.

Figure 12A:
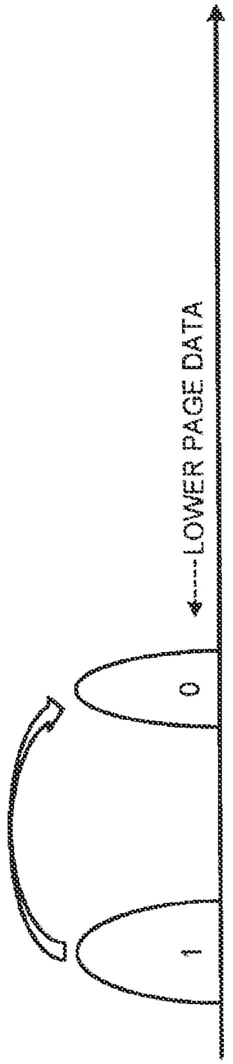
FIGS. 12A to 12C are views showing threshold distributions after programming of memory cells according to the second embodiment.
Figure 12B:
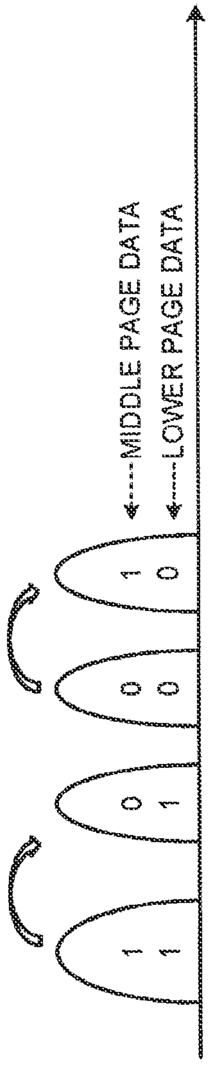
Figure 12C:
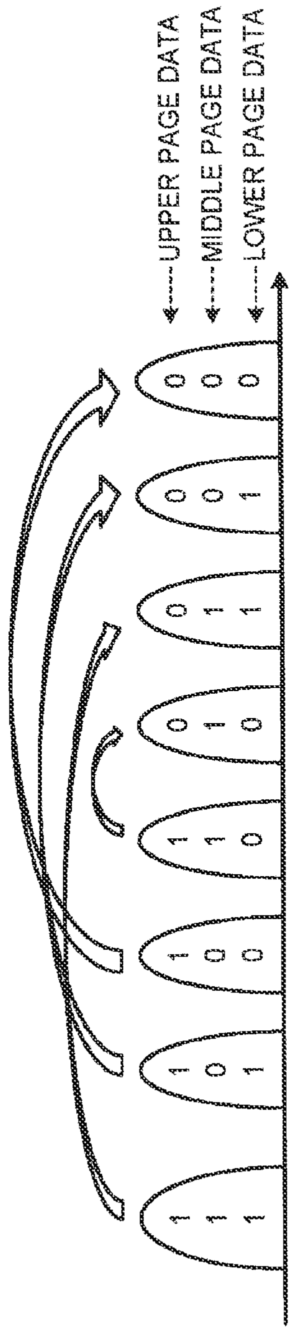

FIGS. 12A to 12C are views showing threshold distributions after programming of memory cells according to this embodiment. FIG. 12A shows threshold distributions after programming of the Lower page, FIG. 12B shows threshold distributions after programming of the Middle page, and FIG. 12C shows threshold distributions after programming of the Upper page. In this embodiment, programming can be performed for the pages one by one, but the order of programming is fixed such that writing is performed to the Lower page, the Middle page, and the Upper page in this order.

As shown in FIG. 12A, in programming of the Lower page, the control unit 22 of the nonvolatile memory 2 operates in accordance with the bit value to be written to the Lower page, and sets each of the memory cells to be kept in the distribution Er or to be shifted upward by, one level to the distribution B by injecting an electric charge. Specifically, the control unit 22 performs programming such that, when the bit value to be written to the Lower page is “1”, no electric charge is injected, and, when the bit value to be written to the Lower page is “0”, an electric charge is injected to shift the threshold voltage to the distribution B.

As shown in FIG. 12B, in writing of a memory cell group whose Lower page has already been subjected to writing, the control unit 22 performs programming of the Middle page. Specifically, if a memory cell is in the distribution Er state due to the programming of the Lower page, the control unit 22 performs programming such that, when the bit value to be written to the Middle page is “1”, the memory cell is kept in the distribution Er, and, when the bit value to be written to the Middle page is “0”, it is shifted to the distribution A. Further, if a memory cell is in the distribution B state due to the programming of the Lower page, the control unit 22 performs programming such that, when the bit value to be written to the Middle page is “0”, the memory cell is kept in the distribution B, and, when the bit value to be written to the Middle page is “1”, it is shifted to the distribution C. In the first embodiment, when the bit value to be written is “1”, no electric charge is injected, and, when the bit value is “0”, an electric charge is injected to shift the threshold distribution. However, in this embodiment, the writing of the Middle page includes a case where, when the bit value to be written is “0”, no electric charge is injected, and, when the bit value is “1”, an electric charge is injected.

As shown in FIG. 12C, in writing of a memory cell group whose Middle page has already been subjected to writing, the control unit 22 performs programming of the Upper page. Specifically, if a memory cell is in the distribution Er state due to the programming of the Middle page, the control unit 22 perform programming such that, when the bit value to be written to the Upper page is “1”, the memory cell is kept in the distribution Er, and, when the bit value to be written to the Upper page is “0”, it is shifted to the distribution E. Further, if a memory cell is in the distribution A state due to the programming of the Middle page, the control unit 22 performs programming such that, when the bit value to be written to the Upper page is “1”, the memory cell is kept in the distribution A, and, when the bit value to be written to the Upper page is “0”, it is shifted to the distribution F. Further, if a memory cell is in the distribution B state due to the programming of the Middle page, the control unit 22 performs programming such that, when the bit value to be written to the Upper page is “1”, the memory cell is kept in the distribution B, and, when the bit value to be written to the Upper page is “0”, it is shifted to the distribution G. Further, if a memory cell is in the distribution C state due to the programming of the Middle page, the control unit 22 performs programming such that, when the bit value to be written to the Upper page is “1”, the memory cell is kept in the distribution C, and, when the bit value to be written to the Upper page is “0”, it is shifted to the distribution D.

Figure 13:
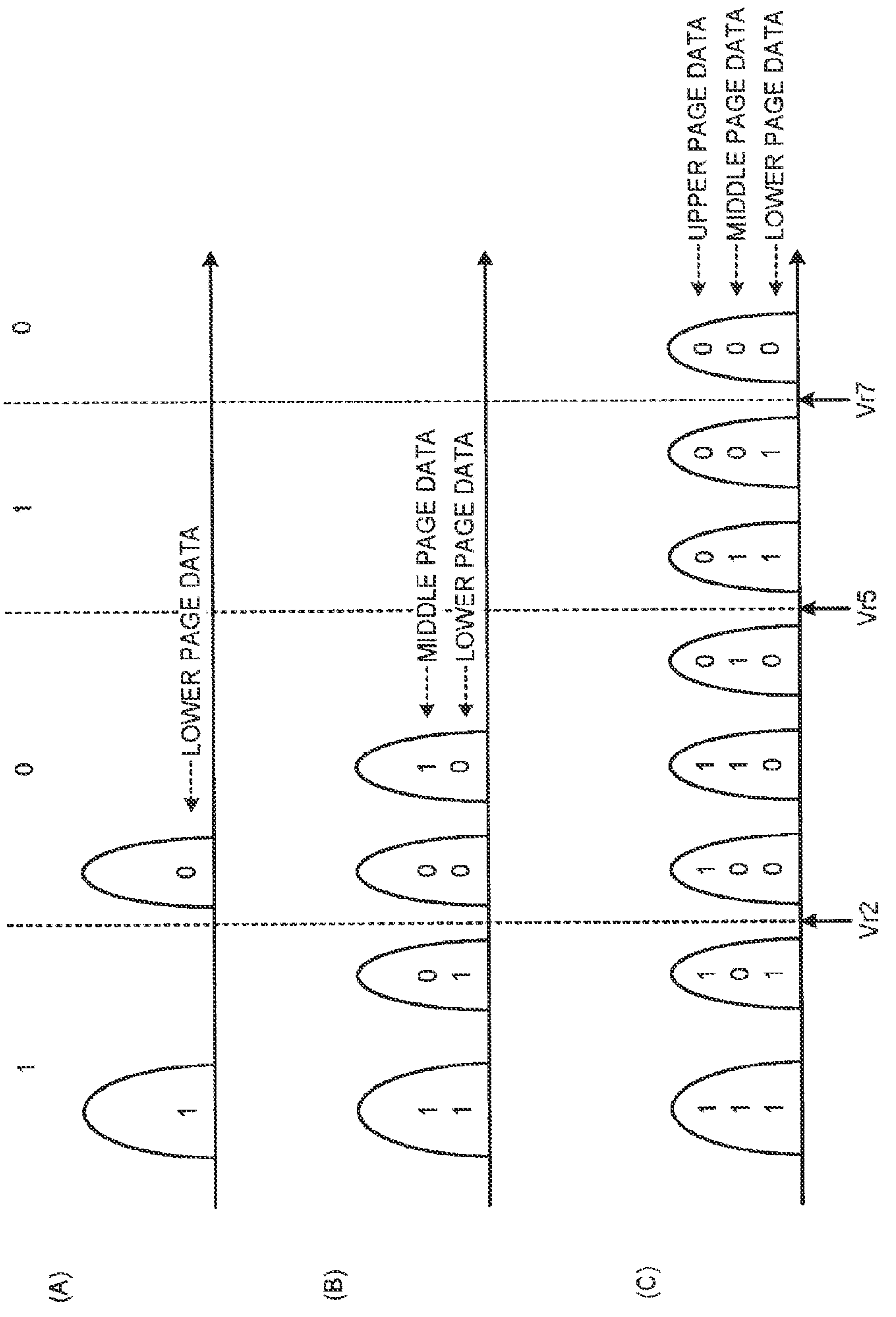
FIG. 13 is a view showing a method of reading a Lower page according to the second embodiment.

Next, an explanation will be given of reading according to this embodiment. FIG. 13 is a view showing a method of reading the Lower page according to this embodiment. In this embodiment, regardless of how many pages writing has been performed to, the bit value of the Lower page can be read by applying three voltages Vr2, Vr5, and Vr7 as read voltages.

Figure 14:
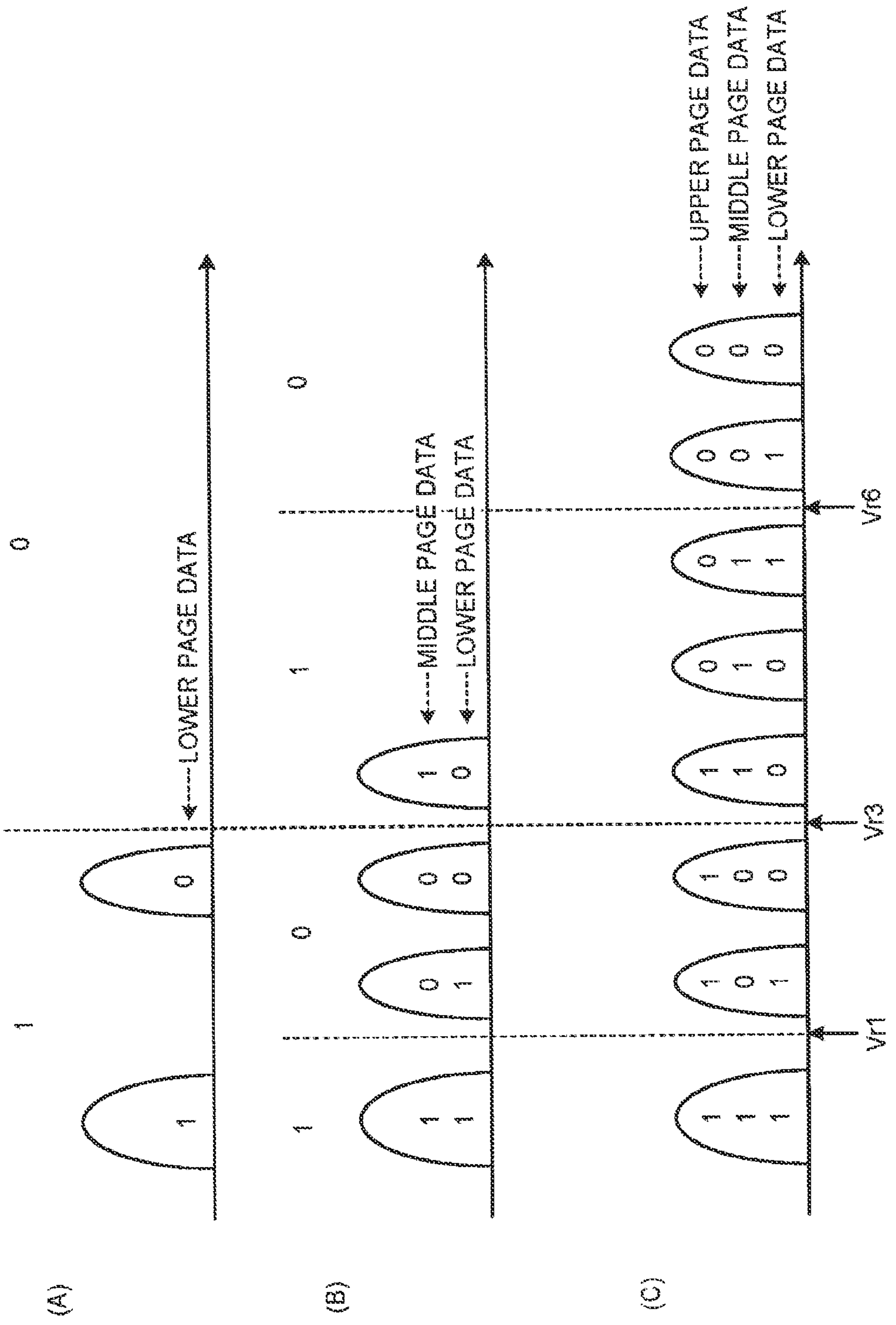
FIG. 14 is a view showing a method of reading a Middle page according to the second embodiment.

FIG. 14 is a view showing a method of reading the Middle page according to this embodiment. In this embodiment, reading of the Middle page is performed by applying three voltages Vr1, Vr3, and Vr6 as read voltages. However, depending on whether or not the Middle page has been subjected to writing, data coding used for reading differs. Accordingly, the control unit 22 makes reference to the page writing flag. If the flag shows a state where writing has been performed to the Lower page, as shown in of FIG. 14, the control unit 22 operates in accordance with the data coding shown in FIG. 11A, such that, when the threshold voltage is not lower than Vr3, the control unit 22 judges the bit value as “0”, and, when the threshold voltage is lower than Vr3, it judges the bit value as “1”. If the flag shows a state where writing has been performed up to the Middle page or the Upper page, as shown in (B) or (C) of FIG. 14, the control unit 22 operates in accordance with the data coding shown in FIG. 11B, and determines the bit value based on the read results obtained by Vr1, Vr3, and Vr6.

Figure 15:
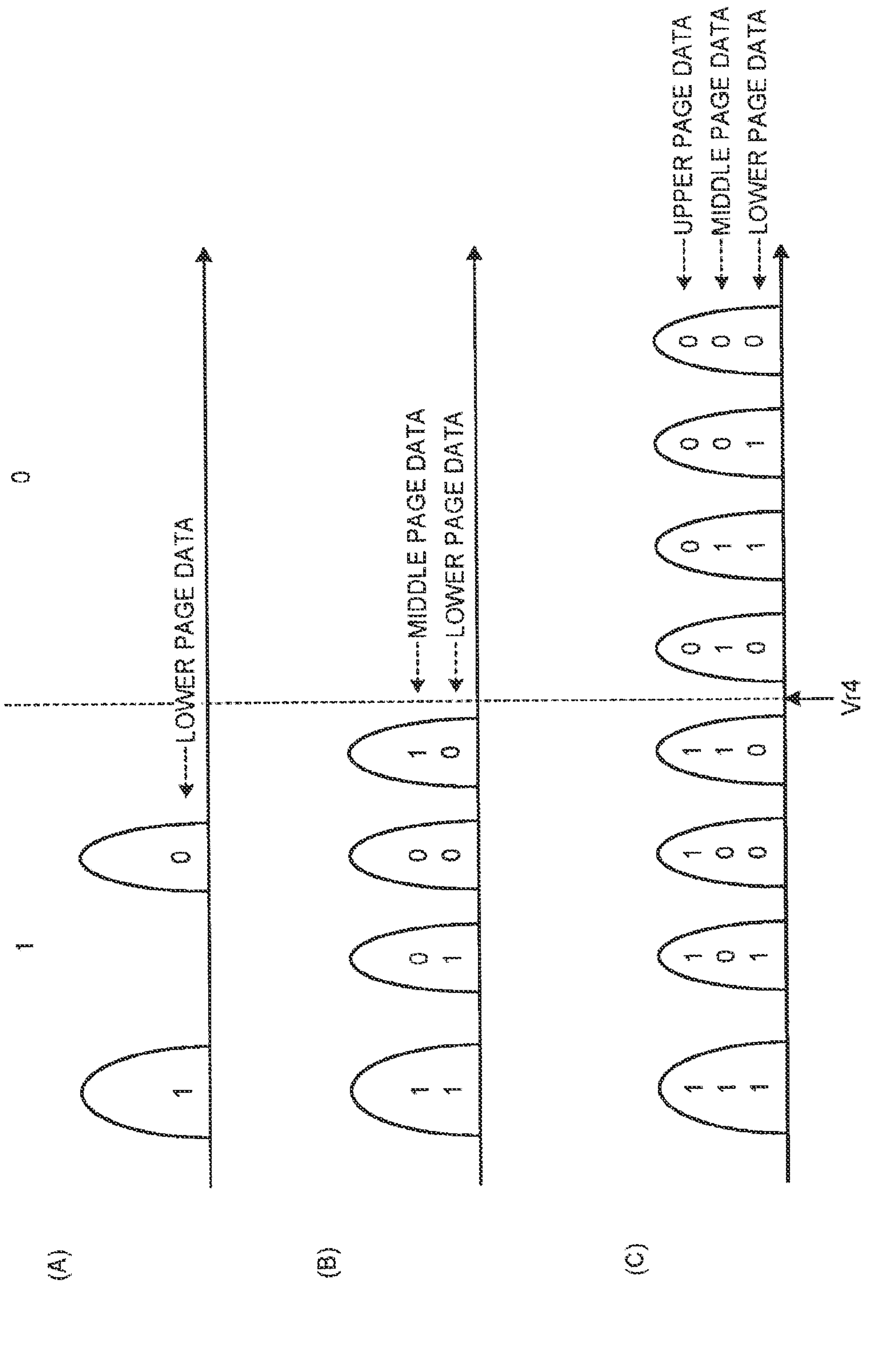
FIG. 15 is a view showing a method of reading an Upper page according to the second embodiment.

FIG. 15 is a view showing a method of reading an Upper page according to this embodiment. In this embodiment, regardless of how many pages writing has been performed to, the bit value of the Upper page can be read by applying Vr4 as a read voltage.

As shown in FIGS. 12A to 12C, the writing sequence according to this embodiment shifts threshold distributions in accordance with the bit value to be written. Specifically, this sequence is the same as that of the first embodiment except that the data coding is different.

Figure 16:
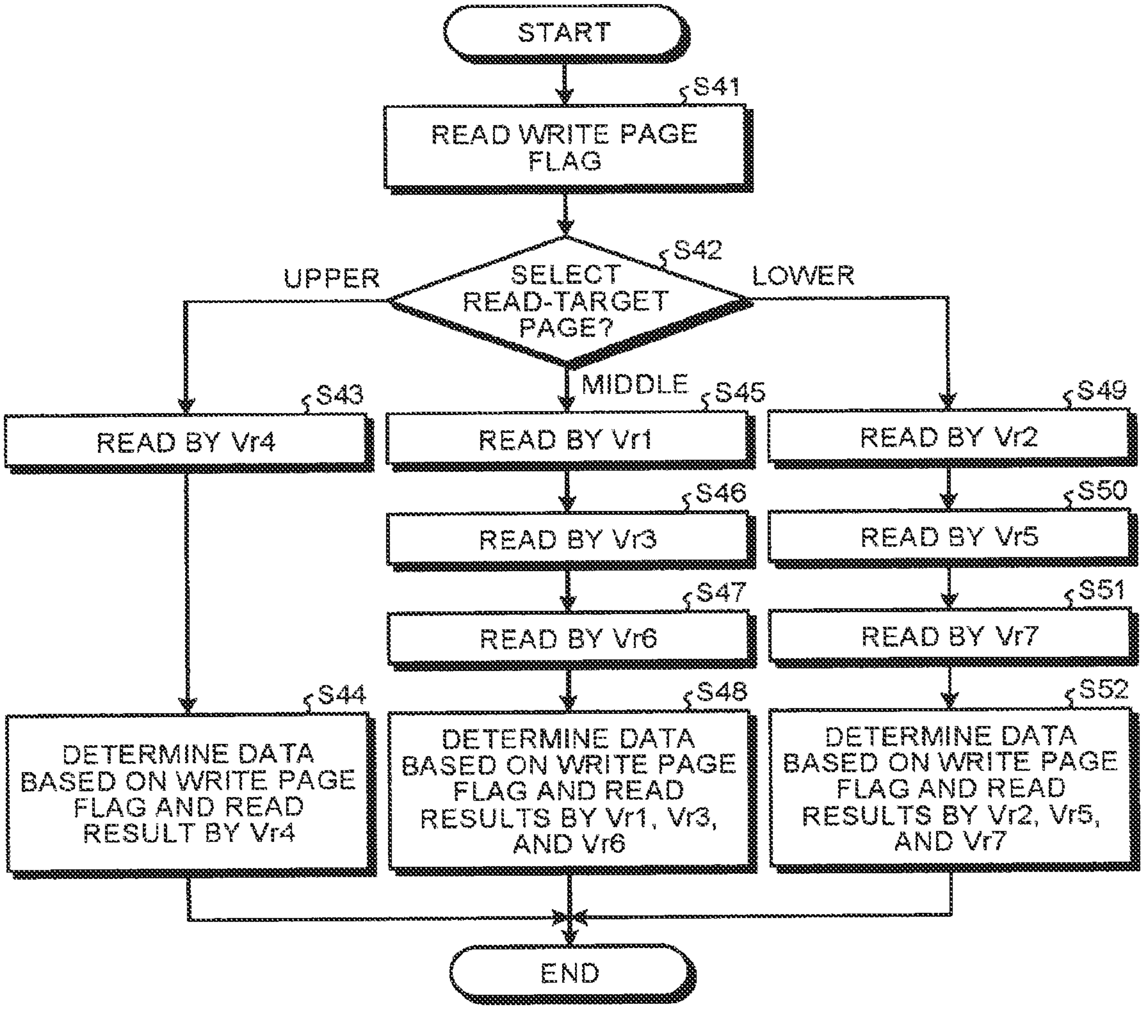
FIG. 16 is a flow chart showing an example of a reading sequence according to the second embodiment.

FIG. 16 is a flow chart showing an example of a reading sequence according to this embodiment. FIG. 16 shows an example of a sequence about one memory cell group. At first, the control unit 22 reads the write page flag of a read-target memory cell group (step S41). Then, it proceeds with steps S42 and S43 that are the same as the steps S21 and S22 of the first embodiment. After the step S43, the control unit 22 determines the data based on the write page flag and the read result obtained by Vr4 (step S44).

When selecting the Middle page in the step S42 (Middle from step S42), the control unit 22 performs reading by use of Vr1 (step S45). Then, the control unit 22 performs reading by use of Vr3 (step S46). Then, the control unit 22 performs reading by use of Vr6 (step S47). Then, the control unit 22 determines the data based on the write page flag and the read results obtained by Vr1, Vr3, and Vr6 (step S48), and ends the process. Specifically, if the write page flag has a value representing a state where writing has been performed to the Lower page, the control unit 22 operates in accordance with the data coding shown in FIG. 11A, such that, when the threshold voltage is not lower than Vr3, the control unit 22 judges the bit value as “0”, and, when the threshold voltage is lower than Vr3, it edges the bit value as “1”, If the write page flag has a value representing a state where writing has been performed up to the Upper page or the Middle page, the control unit 22 operates in accordance with the data coding shown in FIG. 11B, and determines the bit value based on the read results obtained by Vr1, Vr3, and Vr6.

When selecting the Lower page (Lower from step S42), the control unit 22 performs reading by use of Vr2 (step S49). Then, the control unit 22 performs reading by use of Vr5 (step S50). Then, the control unit 22 performs reading by use of Vr7 (step S51). Then, the control unit 22 determines the data based on the write page flag and the read results obtained by Vr2, Vr5, and Vr7 (step S52), and ends the process.

in reading of the Lower page and the Upper page, the same data coding can be used regardless of the write page flag, as described above, and so there may be no need to consider the write page flag in the steps S48 and S52.

In this embodiment, in order to discriminate how many pages has been programmed, as described above, this information is held as a write page flag when page programming is performed. For example, in a memory group for storing user data in the NAND memory cell array 23, this write page flag may be held in a memory cell other than the memory cells that stores the user data. Further, the flag may be stored in a memory cell Group other than the memory group that stores the user data in the WAND memory cell array 23, or may be held in a storage area of a memory inside the nonvolatile memory 2 or memory controller 1. In this way, the method for managing write page flags is not limited to a specific one. Further, the timing of reading a write page flag may differ from the timing shown in FIG. 16, as long as it is before the data determination, and, for example, it may be at the same timing as the data reading. Particularly, this read timing can be suitably used if the write page flag is held in the memory cell group that stores the user data.

As described above, this embodiment manages how many pages writing has been performed to, by use of write page flags, in accordance with the 1-3-3 coding shown in FIGS. 11A and 11B, so that writing can be performed to the pages one by one. Accordingly, this embodiment can reduce the deviations in boundary number between the pages, and can smooth the error generation probabilities between the pages, and it can further provide decreases in the cost and/or power consumption of the memory device, along with increases in the writing and reading rates.

Third Embodiment

FIGS. 17A to 17C are views showing data coding according to a third embodiment. This embodiment employs a memory device and a nonvolatile memory 2 that have the same configurations as those of the first embodiment. Hereinafter in this embodiment, an explanation will be given of differences from the first embodiment.

FIG. 17A shows data coding for writing of the Lower page, FIG. 17B shows data coding for writing of the Middle page, and FIG. 17C shows data coding for writing of the Upper page.

In FIGS. 17A to 17C, there is a threshold distribution (region) surrounded by a rectangular line to indicate that data value allocation is changed for this threshold distribution, depending on how many pages writing has been performed to. Further, there is a threshold distribution provided with hatching to indicate that this distribution is not used in writing of the corresponding page. This embodiment manages how many pages writing has been performed to, by use of write page flags, as in the second embodiment.

Figures 18A, 18B, 18C:
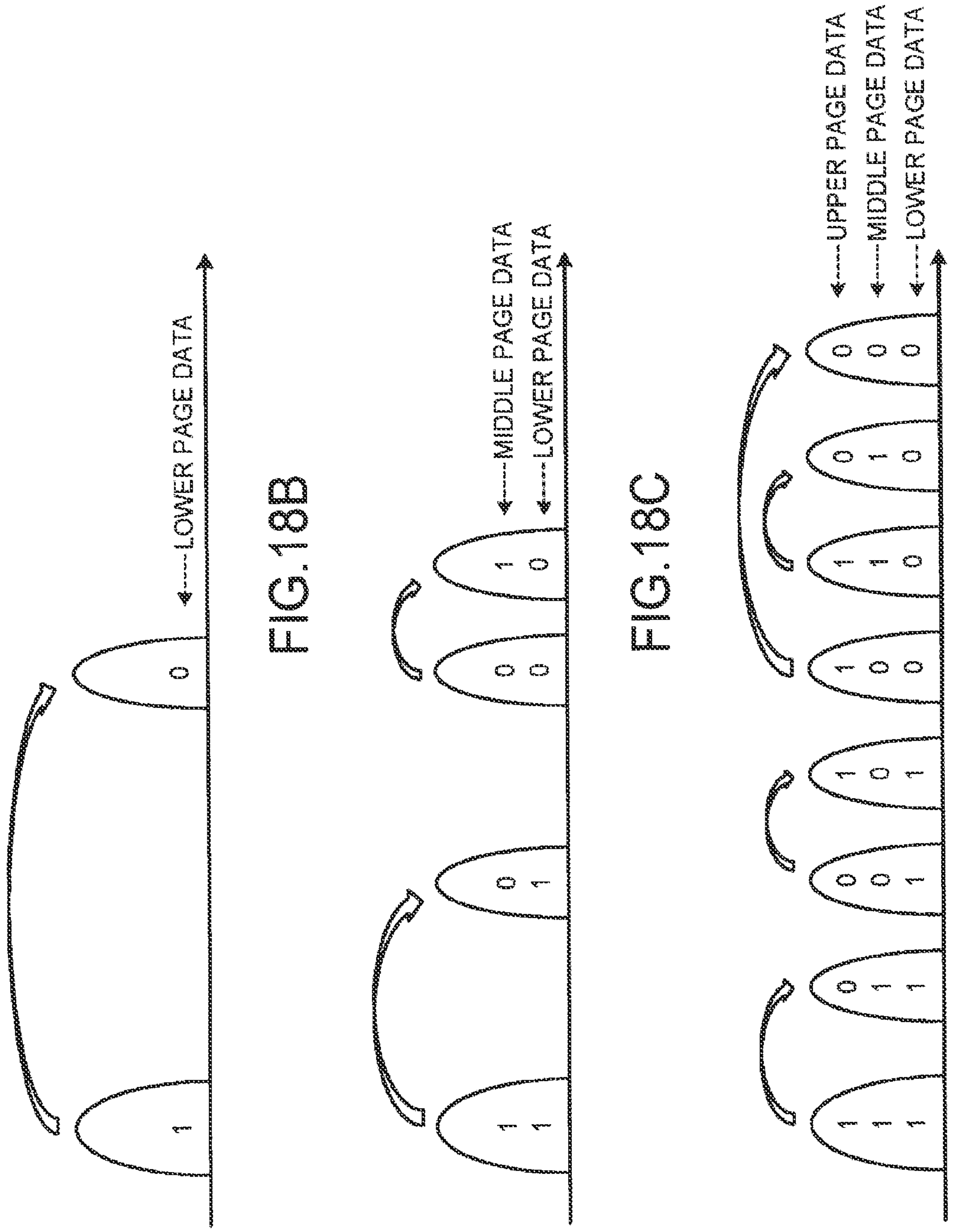
FIGS. 18A to 18C are views showing threshold distributions after programming of memory cells according to the third embodiment.

FIGS. 18A to 18C are views showing threshold distributions after programming of memory cells according to this embodiment. FIG. 18A shows threshold distributions after programming of the Lower page, FIG. 18B shows threshold distributions after programming of the Middle page, and FIG. 18C shows threshold distributions after programming of the Upper page. In this embodiment, programming can be performed for the pages one by one, but the order of programming is fixed such that writing is performed to the Lower page, the Middle page, and the Upper page in this order.

As shown in FIG. 18A, the control unit 22 of the nonvolatile memory 2 performs programming such that, when the bit value to be written to the Lower page is “1”, no electric charge is injected, and, when the bit value to be written to the Lower page is “0”, an electric charge is injected to shift the threshold voltage to the distribution D.

As shown in FIG. 18B, in writing of a memory cell group whose Lower page has already been subjected to writing, if a memory cell is in the distribution Er state due to the programming of the Lower page, the control unit 22 performs programming such that, when the bit value to be written to the Middle page is “1”, the memory cell is kept in the distribution Er, and, when the bit value to be written to the Middle page is “0”, it is shifted to the distribution B. Further, if a memory cell is in the distribution D state due to the programming of the Lower page, the control unit 22 performs programming such that, when the bit value to be written to the Middle page is “0”, the memory cell is kept in the distribution D, and, when the bit value to be written to the Middle page is “1”, it is shifted to the distribution E.

As shown in FIG. 18C, in writing of a memory cell group whose Middle page has already been subjected to writing, if a memory cell is in the distribution Er state due to the programming of the Middle page, the control unit 22 performs programming such that, when the bit value to be written to the Upper page is “1”, the memory cell kept in the distribution Er, and, when the bit value to be written to the Upper page is “0”, it is shifted to the distribution A. Further, if a memory cell is in the distribution B state due to the programming of the Middle page, the control unit 22 performs programming such that, when the bit value to be written to the Upper page is “0”, the memory cell is kept in the distribution B, and, when the bit value to be written to the Upper page is “1”, it is shifted to the distribution C. Further, if memory cell is in the distribution D state due to the programming of the Middle page, the control unit 22 performs programming such that, when the bit value to be written to the Upper page is “1”, the memory cell is kept in the distribution D, and, when the bit value to be written to the Upper page is “0”, it is shifted to the distribution G. Further, if a memory cell is in the distribution F state due to the programming of the Middle page, the control unit 22 performs programming such that, when the bit value to be written to the Upper page is “1”, the memory cell is kept in the distribution F, and, when the bit value to be written to the Upper page is “0”, it is shifted to the distribution F.

In the first embodiment, when the bit value to be written is “1”, no electric charge is injected, and, when the bit value is “0”, an electric charge is injected to shift the threshold distribution. However, in this embodiment, the writing of the Middle page and the Upper page includes a case where, when the bit value to be written is “0”, no electric charge is injected, and, when the bit value is “1”, an electric charge is injected. Accordingly, in the data coding shown in FIGS. 17A to 17C, each of the Middle page and the Upper page includes a distribution at one place, for which data value allocation is changed, depending on how many pages writing has been performed to.

As shown in FIGS. 18A to 18C, the writing sequence according to this embodiment shifts threshold distributions in accordance with the bit value to be written. Specifically, this sequence is the same as that of the first embodiment except that the data coding is different.

The reading sequence according to this embodiment is the same as that of the second embodiment except that the data coding is different, and so it determines the data value by use of the write page flag and the read results of the respective pages obtained by the read voltages serving as boundaries. Specifically, in this embodiment, reading of the Upper page is performed by use of Vr1, Vr3, and Vr6, reading of the Middle page is performed by use of Vr2, Vr5, and Vr7, and reading of the Lower page is performed by use of Vr4. If writing has been performed up to the Upper page, the bit value is determined in accordance with the data coding shown in FIG. 17C. If writing has been performed up to the Middle page, the bit value is determined in accordance with the data coding shown in FIG. 17B. In a case where writing has been performed up to the Middle page, a method of determining the bit values of the Lower page and the Middle page is the same as that used in a case where writing has been performed up to the Upper page, but, in reading of the Upper page, when the threshold voltage is judged as being not lower than Vr1 but lower than Vr3, the bit value is determined to be “1”. If the writing has been performed to the Lower page, the bit value is determined in accordance with the data coding shown in FIG. 17A. In a case where writing has been performed to the Lower page, a method of determining the bit values of the Lower page and the Upper page is the same as that used in a case where writing has been performed up to the Upper page, but, in reading of the Middle page, when the threshold voltage is judged as being not lower than Vr2 but lower than Vr5, the bit value is determined to be “1”.

As described above, this embodiment manages how many pages writing has been performed to, by use of write page flags, in accordance with the 3-3-1 coding shown in FIGS. 17A to 17C, so that writing can be performed to the pages one by one. Accordingly, this embodiment can reduce the deviations in boundary number between the pages, and can smooth the error generation probabilities between the pages, and it can further provide decreases in the cost and/or power consumption of the memory device, along with increases in the writing and reading rates.

Fourth Embodiment

FIGS. 19A to 19C are views showing data coding according to a fourth embodiment. This embodiment employs a memory device and a nonvolatile memory 2 that have the same configurations as those of the first embodiment. Hereinafter in this embodiment, an explanation will be given of differences from the First embodiment.

FIG. 19A shows data coding for writing of the Lower page, FIG. 19B shows data coding for writing of the Middle page, and FIG. 19C shows data coding for writing of the Upper page.

In FIGS. 19A to 19C, there is a threshold distribution (region) surrounded by a rectangular line to indicate that data value allocation is changed for this threshold distribution, depending on how many pages writing has been performed to. Further, there is a threshold distribution provided with hatching to indicate that this distribution is not used in writing of the corresponding page. This embodiment manages how many pages writing has been performed to, by use of write page flags, as in the second embodiment.

Figure 20A:
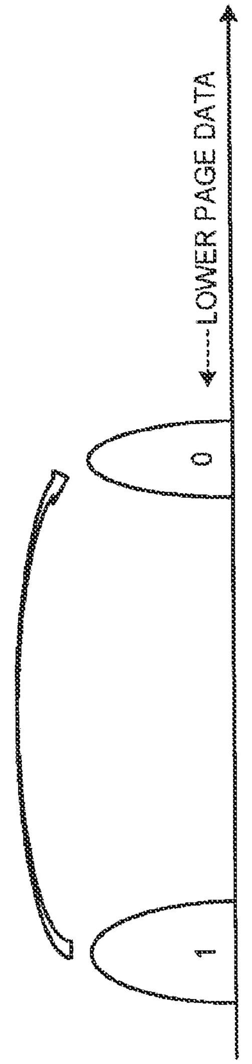
FIGS. 20A to 20C are views showing threshold distributions after programming of memory cells according to the fourth embodiment.
Figure 20B:
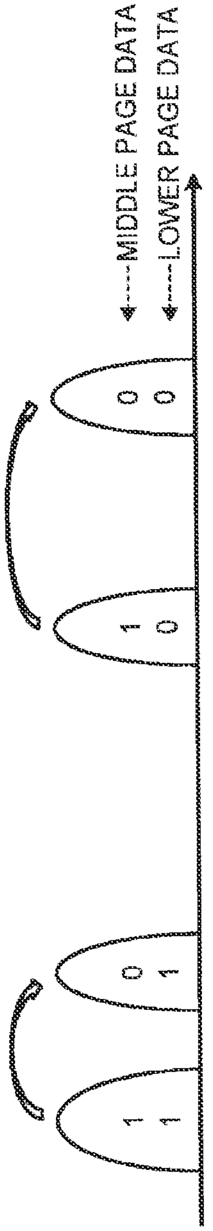
Figure 20C:
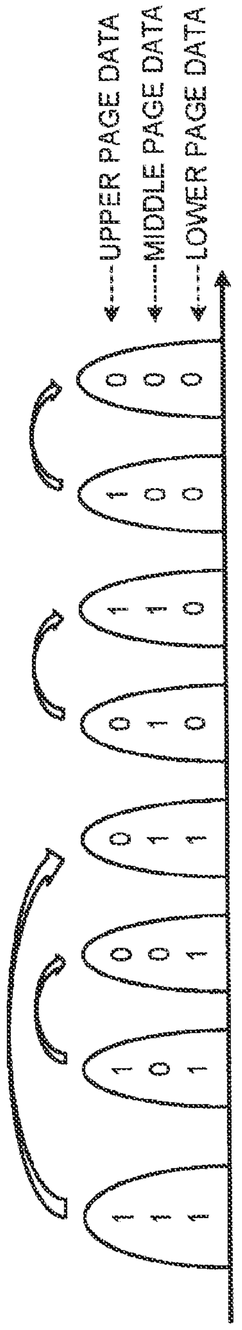

FIGS. 20A to 20C are views showing threshold distributions after programming of memory cells according to this embodiment. FIG. 20A shows threshold distributions after programming of the Lower page, FIG. 20B shows threshold distributions after programming of the Middle page, and FIG. 20C shows threshold distributions after programming of the Upper page. In this embodiment, programming can be performed for the pages one by one, but the order of programming is fixed such that writing is performed to the Lower page, the Middle page, and the Upper page in this order.

As shown in FIG. 20A, the control unit 22 of the nonvolatile memory 2 performs programming such that, when the bit value to be written to the Lower page is “1”, no electric charge is Injected, and, when the bit value to be written to the Lower page is “0” an electric charge is injected to shift the threshold voltage to the distribution D.

As shown in FIG. 20B, in writing of a memory cell group whose Lower page has already been subjected to writing, if a memory cell is in the distribution Er state due to the programming of the Lower page, the control unit 22 performs programming such that, when the bit value to be written to the Middle page is “1”, the memory cell is kept in the distribution Er, and, when the bit value to be written to the Middle page is “0”, it is shifted to the distribution A. Further, if a memory cell is in the distribution D state due to the programming of the Lower page, the control unit 22 perform programming such that, when the bit value to be written to the Middle page is “1”, the memory cell is kept in the distribution D, and, when the bit value to be written to the Middle page is “0”, it is shifted to the distribution F.

As shown in FIG. 20C, in writing of a memory cell group whose Middle page has already been subjected to writing, if a memory cell is in the distribution Er state due to the programming of the Middle page, the control unit 22 performs programming such that, when the bit value to be written to the Upper page is “1”, the memory cell is kept in the distribution Er, and, when the bit value to be written to the Upper page is “0”, it is shifted to the distribution C. Further, if a memory cell is in the distribution A state due to the programming of the Middle page, the control unit 22 performs programming such that, when the bit value to be written to the Upper page is "1", the memory cell is kept in the distribution A, and, when the bit value to be written to the Upper page is "0", it is shifted to the distribution B. Further, if a memory cell is in the distribution U state due to the programming of the Middle page, the control unit 22 performs programming such that, when the bit value to be written to the Upper page is "0", the memory cell is kept in the distribution D, and, when the bit value to be written to the Upper page is "1", it is shifted to the distribution E. Further, if a memory cell is in the distribution F state due to the programming of the Middle page, the control unit 22 performs programming such that, when the bit value to be written to the Upper page is "1", the memory cell is kept in the distribution F, and, when the bit value to be written to the Upper page is "0", it is shifted to the distribution G.

In the first embodiment, when the bit value to be written is "1", no electric charge is injected, and, when the bit value is "0", an electric charge is injected to shift the threshold distribution. However, in this embodiment, the writing of the Upper page includes a case where, when the bit value to be written is "0", no electric charge is injected, and, when the bit value is "1", an electric charge is injected. Accordingly, in the data coding shown in FIGS. 19A to 19C, the Upper page includes a distribution at one place, for which data value allocation is changed, depending on how many pages writing has been performed to.

As shown in FIGS. 20A to 20C, the writing sequence according to this embodiment shifts threshold distributions in accordance with the bit value to be written. Specifically, this sequence is the same as that of the first embodiment except that the data coding is different.

The reading sequence according to this embodiment is the same as that of the second embodiment except that the data coding is different, and so it determines the data value by use of the write page flag and the read results of the respective pages obtained by the read voltages serving as boundaries. Specifically, in this embodiment, reading of the Upper page is performed by use of Vr2, Vr5, and Vr7, reading of the Middle page is performed by use of Vr1, Vr3, and Vr6, and reading of the Lower page is performed by use of Vr4. If writing has been performed up to the Upper page, the bit value is determined in accordance with the data coding shown in FIG. 19C. If writing has been performed up to the Middle page, the bit value is determined in accordance with the data coding shown in FIG. 19B. In a case where writing has been performed up to the Middle page, a method of determining the bit values of the Lower page and the Middle page is the same as that used in a case where writing has been performed up to the Upper page, but, in reading of the Upper page, when the threshold voltage is judged as being not lower than Vr2 but lower than Vr5, the bit value is determined to be "1". If the writing has been performed to the Lower page, the bit value is determined in accordance with the data coding shown in FIG. 19A. In a case where writing has been performed to the Lower page, a method of determining the bit values of the Lower page and the Middle page is the same as that used in a case where writing has been performed up to the Upper page, but, in reading of the Upper page, when the threshold voltage is judged as being not lower than Vr2 but lower than Vr5, the bit value is determined to be "1".

As described above, this embodiment manages how many pages writing has been performed to, by use of write page flags, in accordance with the 3-3-1 coding shown in FIGS. 19A to 19C, so that writing can be performed to the pages one by one. Accordingly, this embodiment can reduce the deviations in boundary number between the pages, and can smooth the error generation probabilities between the pages, and it can further provide decreases in the cost and/or power consumption of the memory device, along with increases in the writing and reading rates.

Fifth Embodiment

FIGS. 21A to 21C are views showing data coding according to a fifth embodiment. This embodiment employs a memory device and a nonvolatile memory 2 that have the same configurations as those of the first embodiment. Hereinafter in this embodiment, an explanation will be given of differences from the first embodiment.

FIG. 21A shows data coding for writing of the Lower page, FIG. 21B shows data coding for writing of the Middle page, and FIG. 21C shows data coding for writing of the Upper page.

In FIGS. 21A to 21C, there is a threshold distribution (region) surrounded by a rectangular line to indicate that data value allocation is changed for this threshold distribution, depending on how many pages writing has been performed to. Further, there is a threshold distribution provided with hatching to indicate that this distribution is not used in writing of the corresponding page. This embodiment manages how many pages writing has been performed to, by use of write page flags, as in the second embodiment.

Figure 22A:
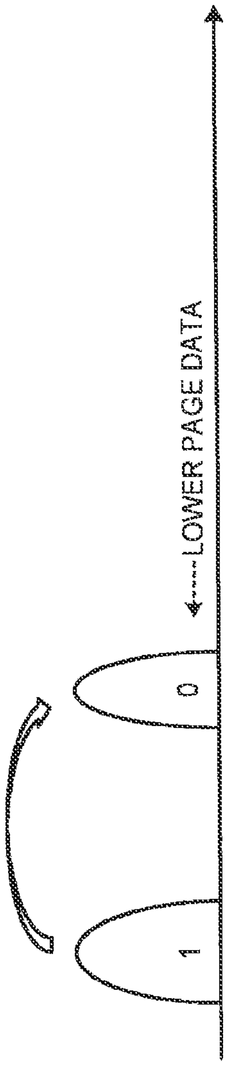
FIGS. 22A to 22C are views showing threshold distributions after programming of memory cells according to the fifth embodiment.
Figure 22B:
Figure 22C:
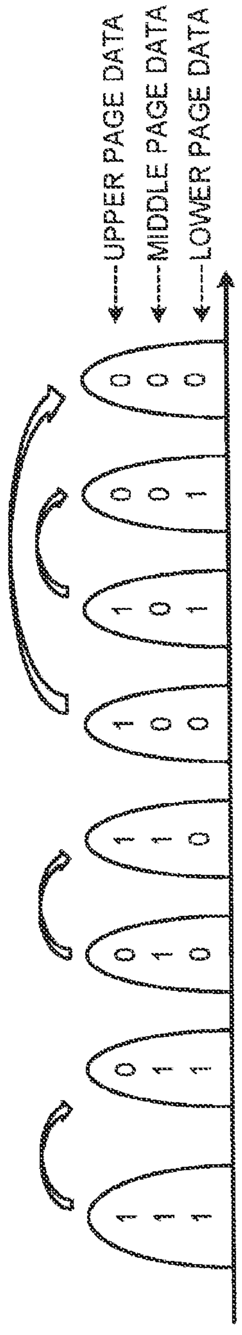

FIGS. 22A to 22C are views showing threshold distributions after programming of memory cells according to this embodiment. FIG. 22A shows threshold distributions after programming of the Lower page, FIG. 22B shows threshold distributions after programming of the Middle page, and FIG. 22C shows threshold distributions after programming of the Upper page. In this embodiment, programming can be performed for the pages one by one, but the order of programming is fixed such that writing is performed to the Lower page, the Middle page, and the Upper page in this order.

As shown in FIG. 22A, the control unit 22 of the nonvolatile memory 2 performs programming such that, when the bit value to be, written to the Lower page is "1", no electric charge is injected, and, when the bit value to be written to the Lower page is "0", an electric charge is injected to shift the threshold voltage to the distribution B.

As shown in FIG. 22B, in writing of a memory cell group whose Lower page has already been subjected to writing, if a memory cell is in the distribution Er state due to the programming of the Lower page, the control unit 22 performs programming such that, when the bit value to be written to the Middle page is "1", the memory cell is kept in the distribution Er, and, when the bit value to be written to the Middle page is "0", it is shifted to the distribution E. Further, if a memory cell is in the distribution B state due to the programming of the Lower page, the control unit 22 performs programming such that, when the bit value to be written to the Middle page is "1", the memory cell is kept in the distribution B, and, when the bit value to be written to the Middle page is "0", it is shifted to the distribution D.

As shown in FIG. 22C, in writing of a memory cell group whose Middle page has already been subjected to writing, if a memory cell is in the distribution Er state due to the programming of the Middle page, the control unit 22 performs programming such that, when the bit value to be written to the Upper page is "1", the memory cell is kept in the distribution Er, and, when the bit value to be written to the Upper page is "0", it is shifted to the distribution A.

Further, if a memory cell is in the distribution B state due to the programming of the Middle page, the control unit 22 performs programming such that, when the bit value to be written to the Upper page is "0", the memory cell is kept in the distribution B, and, when the bit value to be written to the Upper page is it is shifted to the distribution C. Further, if a memory cell is in the distribution D state due to the programming of the Middle page, the control unit 22 performs programming such that, when the bit value to be written to the Upper page is "1", the memory cell is kept in the distribution D, and, when the bit value to be written to the Upper page is "0", it is shifted to the distribution G. Further, if a memory cell is in the distribution E state due to the programming of the Middle page, the control unit 22 performs programming such that, when the bit value to be written to the Upper page is "1", the memory cell is kept in the distribution E, and, when the bit value to be written to the Upper page is "0", it is shifted to the distribution F.

In the first embodiment, when the bit value to be written is "1" no electric charge is injected, and, when the bit value is "0", an electric charge is injected to shift the threshold distribution. However, in this embodiment, the writing of the Upper page includes a case where, when the bit value to be written is "0", no electric charge is injected, and, when the bit value is "1", an electric charge is injected. Accordingly, in the data coding shown in FIGS. 21A to 21C, the Upper page includes a distribution at one place, for which data value allocation is changed, depending on how many pages writing has been performed to.

As shown in FIGS. 22A to 22C, the writing sequence according to this embodiment shifts threshold distributions in accordance with the bit value to be written. Specifically, this sequence is the same as that of the first embodiment except that the data coding is different.

The reading sequence according to this embodiment is the same as that of the second embodiment except that the data coding is different, and so it determines the data value by use of the write page flag and the read results of the respective pages obtained by the read voltages serving as boundaries. Specifically, in this embodiment, reading of the Upper page is performed by use of Vr1, Vr3, and Vr6, reading of the Middle page is performed by use of Vr4, and reading of the Lower page is performed by use of Vr2, Vr5, and Vr7. If writing has been performed up to the Upper page, the bit value is determined in accordance with the data coding shown in FIG. 21C. If writing has been performed up to the Middle page, the bit value is determined in accordance with the data coding shown in FIG. 21B. In a case where writing has been performed up to the Middle page, a method of determining the bit values of the Lower page and the Middle page is the same as that used in a case where writing has been performed up to the Upper page, but, in reading of the Upper page, when the threshold voltage is judged as being not lower than Vr1 but lower than Vr3, the bit value is determined to be "1". If the writing has been performed to the Lower page, the bit value is determined in accordance with the data coding shown in FIG. 21A. In a case where writing has been performed to the Lower page, a method of determining the bit values of the Lower page and the Middle page is the same as that used in a case where writing has been performed up to the Upper page, but, in reading of the Upper page, when the threshold voltage is judged as being not lower than Vr1 but lower than Vr3, the bit value is determined to be "1".

As described above, this embodiment manages how many pages writing has been performed to, by use of write page flags, in accordance with the 3-1-3 coding shown in FIGS. 21A to 21C, so that writing can be performed to the pages one by one. Accordingly, this embodiment can reduce the deviations in boundary number between the pages, and can smooth the error generation probabilities between the pages, and it can further provide decreases in the cost and/or power consumption of the memory device, along with increases in the writing and reading rates.

Sixth Embodiment

FIGS. 23A to 23C are views showing data coding according to a sixth embodiment. This embodiment employs a memory device and a nonvolatile memory 2 that have the same configurations as those of the first embodiment. Hereinafter in this embodiment, an explanation will be given of differences from the first embodiment.

FIG. 23A shows data coding for writing of the Lower page, FIG. 23B shows data coding for writing of the Middle page, and FIG. 23C shows data coding for writing of the Upper page.

in FIGS. 23A to 23C, there is a threshold distribution (region) surrounded by a rectangular line to indicate that data value allocation is changed for this threshold distribution, depending on how many pages writing has been performed to. Further, there is a threshold distribution provided with hatching to indicate that this distribution is not used in writing of the corresponding page. This embodiment manages how many pages writing has been performed to, by use of write page flags, as in the second embodiment.

Figure 24A:
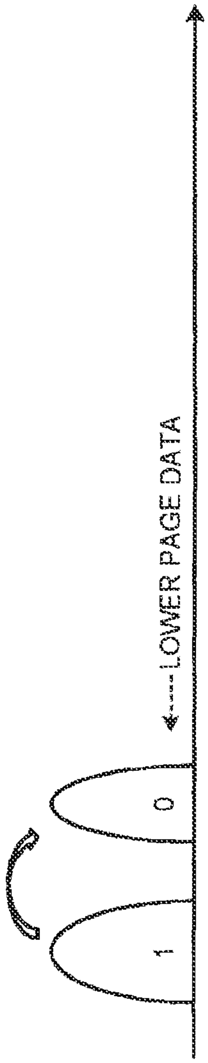
FIGS. 24A to 24C are views showing threshold distributions after programming of memory cells according to the sixth embodiment.
Figure 24B:
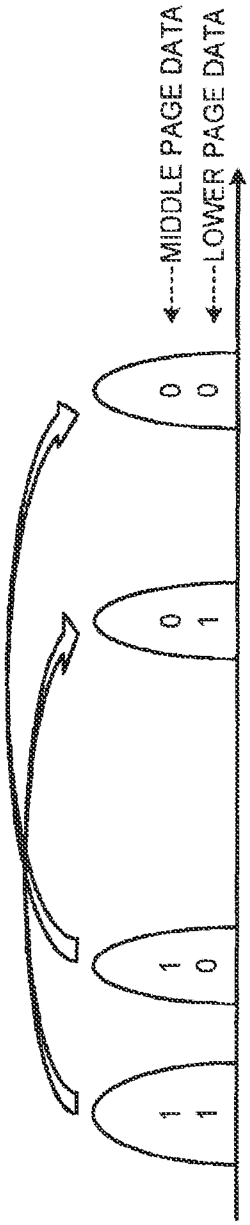
Figure 24C:
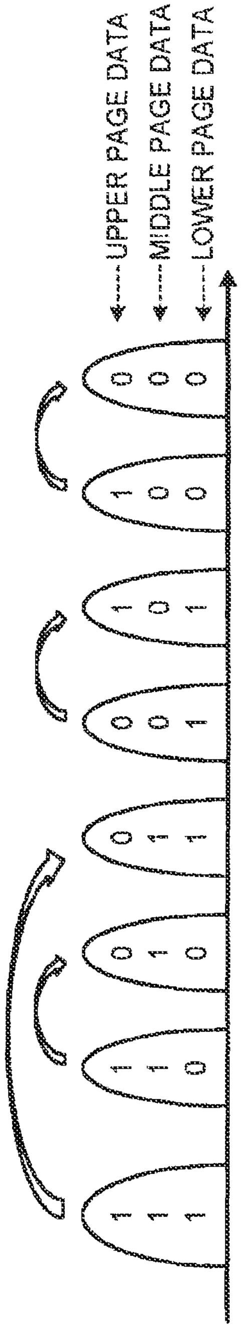

FIGS. 24A to 24C are views showing threshold distributions after programming of memory cells according to this embodiment. FIG. 24A shows threshold distributions after programming of the Lower page, FIG. 24B shows threshold distributions after programming of the Middle page, and FIG. 24C shows threshold distributions after programming of the Upper page. In this embodiment, programming can be performed for the pages one by one, but the order of programming is fixed such that writing is performed to the Lower page, the Middle page, and the Upper page in this order.

As shown in FIG. 24A, the control unit 22 of the nonvolatile memory 2 performs programming such that, when the bit value to be written to the Lower page is "1", no electric charge is injected, and, when the bit value to be written to the Lower page is "0", an electric charge is injected to shift the threshold voltage to the distribution A.

As shown in FIG. 24B, in writing of a memory cell group whose Lower page has already been subjected to writing, if a memory cell is in the distribution Er state due to the programming of the Lower page, the control unit 22 performs programming such that, when the bit value to be written to the Middle page is "1", the memory cell is kept in the distribution Er, and, when the bit value to be written to the Middle page is "0", it is shifted to the distribution D. Further, if a memory cell is in the distribution A state due to the programming of the Lower page, the control unit 22 performs programming such that, when the bit value to be written to the Middle page is "1", the memory cell is kept in the distribution A, and, when the bit value to be written to the Middle page is "0", it is shifted to the distribution F.

As shown in FIG. 24C, in writing of a memory cell group whose Middle page has already been subjected to writing, if a memory cell is in the distribution Er state due to the programming of the Middle page, the control unit 22 performs programming such that, when the bit value to be written to the Upper page is the memory cell is kept in the distribution Er, and, when the bit value to be written to the Upper page is "0", it is shifted to the distribution C. Further, if a memory cell is in the distribution A state due to the programming of the Middle page, the control unit 22 performs programming such that, when the bit value to be written to the Upper page is "1", the memory cell is kept in the distribution A, and, when the bit value to be written to the Upper page is "0" it is shifted to the distribution B. Further, if a memory cell is in the distribution D state due to the programming of the Middle page, the control unit 22 performs programming such that, when the bit value to be written to the Upper page is "0", the memory cell is kept in the distribution and, when the bit value to be written to the Upper page is "1", it is shifted to the distribution E. Further, if a memory cell is in the distribution F state due to the programming of the Middle page, the control unit 22 performs programming such that, when the bit value to be written to the Upper page is "1", the memory cell is kept in the distribution F, and, when the bit value to be written to the Upper page is "0", it is shifted to the distribution G.

In the first embodiment, when the bit value to be written is "1", no electric charge is injected, and, when the bit value is "0", an electric charge is injected to shift the threshold distribution. However, in this embodiment, the writing of the Upper page includes a case where, when the bit value to be written is "0", no electric charge is injected, and, when the bit value is "1", an electric charge is injected. Accordingly, in the data coding shown in FIGS. 23A to 23C, the Upper page includes a distribution at one place, for which data value allocation is changed, depending on how many pages writing has been performed to.

As shown in FIGS. 24A to 24C, the writing sequence according to this embodiment shifts threshold distributions in accordance with the bit value to be written. Specifically, this sequence is the same as that of the first embodiment except that the data coding is different.

The reading sequence according to this embodiment is the same as that of the second embodiment except that the data coding is different, and so it determines the data value by use of the write page flag and the read results of the respective pages obtained by the read voltages serving as boundaries. Specifically, in this embodiment, reading of the Upper page is performed by use of Vr2, Vr5, and Vr7, reading of the Middle page is performed by use of Vr4, and reading of the Lower page is performed by use of Vr1, Vr3, and Vr6. If writing has been performed up to the Upper page, the bit value is determined in accordance with the data coding shown in FIG. 23C. If writing has been performed up to the Middle page, the bit value is determined in accordance with the data coding shown in FIG. 23B. In a case where writing has been performed up to the Middle page, a method of determining the bit values of the Lower page and the Middle page is the same as that used in a case where writing has been performed up to the Upper page, but, in reading of the Upper page, when the threshold voltage is judged as being not lower than Vr2 but lower than Vr5, the bit value is determined to be "1", if the writing has been performed to the Lower page, the bit value is determined in accordance with the data coding shown in FIG. 23A. In a case where writing has been performed to the Lower page, a method of determining the bit values of the Lower page and the Middle page is the same as that used in a case where writing has been performed up to the Upper page, but, in reading of the Upper page, when the threshold voltage is judged as being not lower than Vr2 but lower than Vr5, the bit value is determined to be "1".

As described above, this embodiment manages how many pages writing has been performed to, by use of write page flags, in accordance with the 3-1-3 coding shown in FIGS. 23A to 23C, so that writing can be performed to the pages one by one. Accordingly, this embodiment can reduce the deviations in boundary number between the pages, and can smooth the error generation probabilities between the pages, and it can further provide decreases in the cost and/or power consumption of the memory device, along with increases in the writing and reading rates.

Seventh Embodiment

Next, an explanation will be given of a method of reading a memory device according to a seventh embodiment. This embodiment employs a memory device and a nonvolatile memory 2 that have the same configurations as those of the first embodiment. Further, this embodiment employs the same data coding as the first embodiment. Hereinafter in this embodiment, an explanation will be given of differences from the first embodiment.

In general, the threshold of each of the memory cells of a HAND memory fluctuates (varies) due to some causing factors. These causing factors include various factors, such as program disturb, read disturb, and data retention. In reading of a memory cell having a fluctuated threshold, the memory cell may be judged as being in a state corresponding to a threshold distribution (region) different from the threshold distribution (region) corresponding to the written data value, thereby causing an error in the read data. As a countermeasure for this problem, there is a technique of reading the threshold after correcting its fluctuation.

Figure 25:
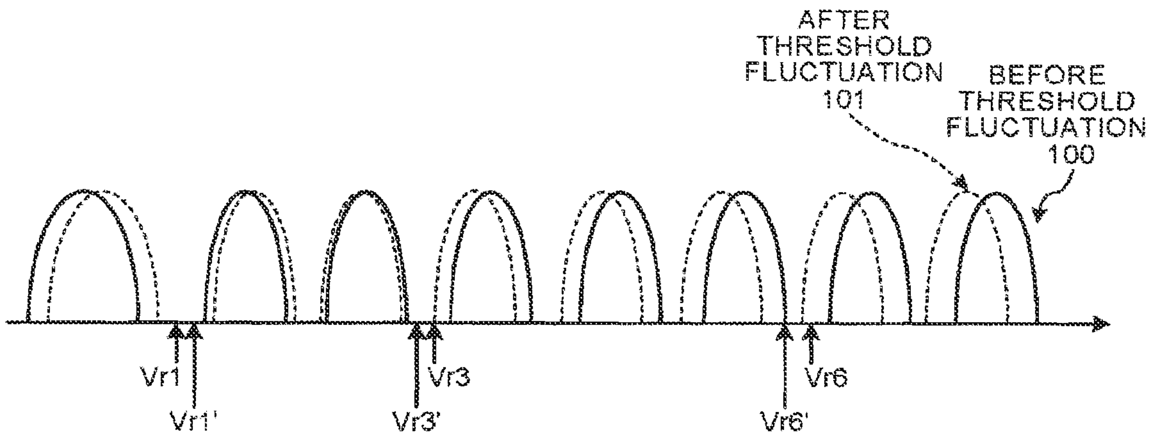
FIG. 25 is a view showing an example of threshold distribution fluctuations.

FIG. 25 is a view showing an example of threshold distribution fluctuations. FIG. 25 shows an example of Threshold fluctuations present in reading of the Lower page programmed to the state shown in (C) of FIG. 6, according to the first embodiment. In FIG. 25, the threshold distributions 100 shown by solid lines indicate threshold distributions in a state before fluctuation, i.e., in an originally written state. The threshold distributions 101 shown by dotted lines indicate threshold distributions in a state after fluctuation. Only one set of threshold distributions is provided with these reference symbols, but the other sets of threshold distributions provided with no reference symbols are shown in the same way where the solid line denotes a state before fluctuation and the dotted line denotes a state after fluctuation. The example of FIG. 25 shows a state of threshold fluctuations due to data retention, where the distributions Er and A have been fluctuated in a positive direction (a direction toward the right side in FIG. 25) and the distributions B to G have been fluctuated in a negative direction (a direction toward the left side in FIG. 25). If reading is performed to the memory cells having threshold fluctuations by use of the original read voltages Vr1, Vr3, and Vr6, for example, some of the memory cells belonging to the distribution F (those on the lower voltage side) come to be judged as falling within a range between Vr3 and Vr6. In this way, when threshold fluctuations are generated, errors are caused in the read data at many memory cells.

In light of this problem, this embodiment employs Vr1', Vr3', and Vr6', which are read voltages including correction on fluctuation, in place of Vr1, Vr3, and Vr6. The method of determining Vr1', Vr3', and Vr6' can be any method, but, for example, it may be a method of performing an error correction process while using different read voltages, so as to select error correctable read voltages to be used as Vr1', Vr3', and Vr6'. The method of determining Vr1', Vr3', and Vr6' is not limited to this method.

Figure 26:
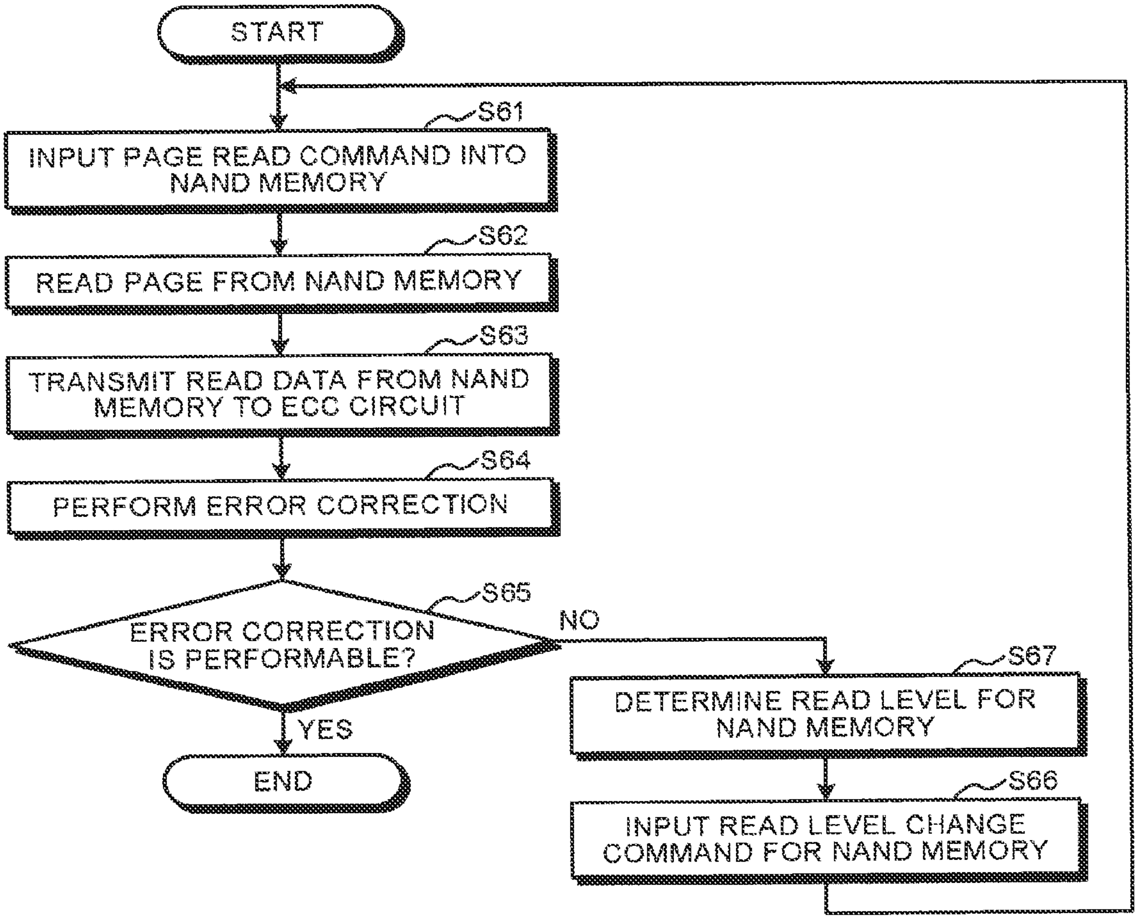
FIG. 26 is a flow chart showing an example of a reading sequence according to a seventh embodiment where read voltages are changed.

FIG. 26 is a flow chart showing an example of a reading sequence according to this embodiment where read voltages are changed. The sequence shown in FIG. 26 may be always used for reading. Alternatively, reading may be performed usually by use of read voltages with no change, and occasionally performed by use of the sequence shown in FIG. 26, only when a certain condition for estimating a threshold fluctuation is satisfied. This certain condition is not limited to a specific one, but, for example, when the error uncorrectable ratio, obtained by an error correction process in reading, exceeds a certain ratio, reading is performed in accordance with read voltage changes shown FIG. 26. As shown in FIG. 26, the processor 12 inputs a page read command (command of requesting reading by page size) via the memory interface 15 into the nonvolatile memory 2 (step S61). The nonvolatile memory 2 reads the data in accordance with the page read command (step S62), and transmits the read data via the memory interface 15 to the ECC circuit 14 (step S63). The reading of the step S62 uses initial values (Vr1, Vr3, and Vr6 in the example shown in FIG. 25) as read voltages, if it has not received a read level change command described later. However, these initial values may be changed based on an instruction from the memory controller 1.

The FCC circuit 14 performs an error correction process by use of the input data (step S64). The FCC circuit 14 notifies the processor 12 of whether or not error correction has been performable by this error correction process. Based on this notification, the processor 12 makes a judgment of whether or not the error correction has been performable (step S65). If the error correction has been performable (Yes from step S65), at ends the process. If the error correction has been not performable (No from step S65), the processor 12 determines the read levels (read voltages) for the nonvolatile memory 2 to be values different from the read volt age used in the step S62 (step S67). Then, based on the determined values, the processor 12 inputs a read level change command via the memory interface 15 into the nonvolatile memory 2 (step S66), and returns to the step S61. The nonvolatile memory 2 changes the read voltages in accordance with the read level change command.

The sequence described above achieves a search for read voltages that make error correction performable. The above-described Vr1', Vr3', and Vr6' shown in FIG. 25 correspond to read voltages that make error correction performable.

The explanation set out above is given of an example using data coding according to the first embodiment, but read voltages may be similarly changed in a case using data coding according to any one of the second to sixth embodiments.

In this embodiment, when writing and reading are performed by use of data coding according to any one of the first to sixth embodiments, read voltages are changed if there are threshold fluctuations. Accordingly, this embodiment provides the effects obtained by the first to sixth embodiments, and further reduces data read errors even if there are threshold fluctuations.

Eighth Embodiment

Next, an explanation will be given of a method of reading a memory device according to an eighth embodiment. This embodiment employs a memory device and a nonvolatile memory 2 that have the same configurations as those of the first embodiment. Further, this embodiment employs the same data coding as the first embodiment. Hereinafter in this embodiment, an explanation will be given of differences from the first embodiment.

When error correction encoding is performed to protect data stored in the nonvolatile memory 2, any error correction code can be used, but soft decision decoding may be adopted for decoding. In a case where soft decision decoding is adopted, codes for performing soft decision decoding, such as LDPC (Low Density Parity Check) codes, are used for encoding, in general. However, it may be designed that codes (such as BCH codes) for performing hard decision decoding are used for encoding and soft decision decoding is adopted for decoding.

This embodiment explains an example that performs soft decision decoding for decoding. The encoding manner is not limited to a specific one, but, for example, the encoding is performed by use of LDPC codes, as described above. When soft decision decoding is performed, so-called soft bit information is read from the nonvolatile memory 2 in addition to hard decision values the same as those for ordinary reading, and the decoding is performed by use of the read hard decision values and the soft bit information. The soft bit information is probability information that represents how close it is to a true value. When a NAND memory is used as the nonvolatile memory 2, if the threshold voltage of each of the memory cells is more distant from the read voltages serving as the boundaries dividing the threshold distributions, it can be considered as being closer to a true value.

Hereinafter, a reading method of reading the soft bit information be referred to as a soft bit read, and the ordinary reading used as a premise in the first embodiment and so forth will be referred to as a hard bit read (HB read). The hard bit read applies one read voltage corresponding to a boundary that divides threshold distributions, and makes a judgment of whether or not the threshold voltage of a memory cell is higher than this boundary. On the other hand, the soft bit read performs reading by use of a plurality of read voltages relative to one boundary serving as a judgment subject. The hardware configuration for performing a soft bit read can be any configuration, but, for example, the nonvolatile memory 2 may be configured to handle both of a soft bit read and an ordinary reading (a hard bit read) as a reading method, and to perform reading based on an instruction from the memory controller 1. Further, the shift amount of read voltage and/or the number of shift types to be used in performing a soft bit read may be set up in advance in the nonvolatile memory 2, or may be instructed from the memory controller 1.

Figure 27:
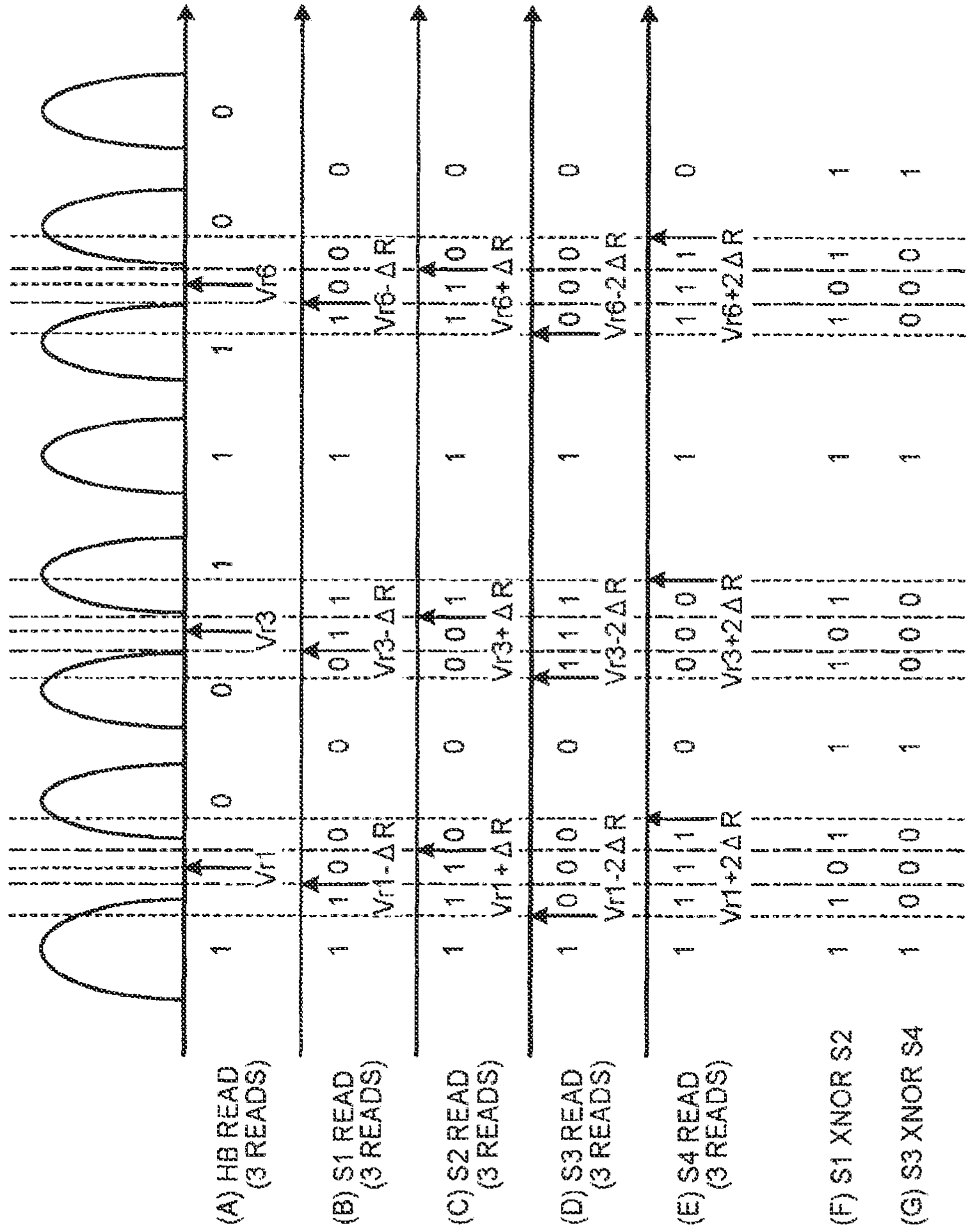
FIG. 27 is a view showing an example of a manner of soft bits.

FIG. 27 is a view showing an example of a manner of soft bits. FIG. 27 shows a manner of reading of the Lower page by use of a soft it read after programming is performed to form the state shown in (C) of FIG. 6 according to the first embodiment. The example shown in FIG. 27 reads two kinds of soft bit information. Basically, the soft bit read is a combination of the hard bit read with reading that uses data read values obtained by shifted read voltages (to see whether or not the threshold voltage of a memory cell is not lower than each of the shifted read voltages). In the example shown in FIG. 27, at first, the nonvolatile memory 2 determines three pieces of data of a hard bit read, respectively based on three read results obtained by use of the ordinary read voltages Vr1, Vr3, and Vr6, respectively, (to see whether or not the threshold voltage is not lower than each of the read voltages) (FIG. 27, (A)). If the threshold voltage is not lower than the read voltage, the data value is "0", and if it is lower than the read voltage, the data value s "1".

The, the nonvolatile memory 2 performs a soft bit read #1 (S1 read) by use of read voltages respectively lower than the voltages Vr1, Vr3, and Vr6 by a predetermined amount ΔR. Then, the nonvolatile memory 2 determines data of the S1 read, based on three read results respectively obtained by use of Vr1−ΔR, Vr3−ΔR, and Vr6−ΔR (FIG. 27, (B)). Then, the nonvolatile memory 2 performs a soft bit read #2 (S2 read) by use of read voltages respectively higher than the voltages Vr1, Vr3, and Vr6 by ΔR. Then, the nonvolatile memory 2 determines data of the S2 read, based on three read results respectively obtained by use of Vr1+ΔR, Vr3+ΔR, and Vr6±ΔR (FIG. 27, (C)).

Then, the nonvolatile memory 2 performs a soft bit read #3 (S3 read) by use of read voltages respectively lower than the voltages Vr1, Vr3, and Vr6 by an amount twice as large as ΔR. Then, the nonvolatile memory 2 determines data of the S3 read, based on three read results respectively obtained by use of Vr1−2ΔR, Vr3−2ΔR, and Vr6−2ΔR (FIG. 27, (D)). Then, the nonvolatile memory 2 performs a soft bit read #4 (S4 read) by use of read voltages respectively higher than the voltages Vr1, Vr3, and Vr6 by an amount twice as large as ΔR. Then, the nonvolatile memory 2 determines data of the S4 read, based on three read results respectively obtained by use of Vr1+2ΔR, Vr3+2ΔR and Vr6+2ΔR (FIG. 27, (E)).

Further, by performing an arithmetical operation of exclusive NOR between the S1 read data and the S2 read data, it is achieved to specify memory cells respectively having threshold voltages that fall within the range between Vr1−ΔR and Vr1+ΔR, within the range between Vr3−ΔR and Vr3+ΔR, and within the range between Vr6−ΔR and Vr6+ΔR (FIG. 27, (F)). Similarly, by performing an arithmetical operation of exclusive NOR between the S3 read data and the S4 read data, it is achieved to specify memory cells respectively having threshold voltages fall within the range between Vr1−2ΔR and Vr1−vΔR, within the range between Vr3−2ΔR and Vr3+2ΔR, and within the range between Vr6−2ΔR and Vr6+2ΔR (FIG. 27, (G)). These results shown in (F) and (G) of FIG. 27 correspond to the two kinds of soft Oat information.

Then, the FCC circuit 14 performs soft decision decoding by use of the hard bit read results and the soft bit information, and thereby performs error correction. In this embodiment, the explanation set out above is given of an example using data coding according to the first embodiment, but a soft bit read may be similarly performed in a case using data coding according to any one of the second to sixth embodiments. Further, when the soft bit read according to this embodiment is performed, the read voltage change according to the seventh embodiment may be additionally performed.

Ninth Embodiment

Next, an explanation will be given of threshold distributions in a memory device according to a ninth embodiment. This embodiment employs a memory device and a nonvolatile memory 2 that have the same configurations as those of the first embodiment. Further, this embodiment employs the same data coding as the first embodiment Hereinafter in this embodiment, an explanation will be given of differences from the first embodiment.

In each of the examples explained in the first to sixth embodiments, the widths of the threshold distributions (regions) used in programming of the Lower page and the Middle page are set the same as the widths eventually necessitated for programming of the Upper page.

In this embodiment, as a modification of the data coding described in the third embodiment, the width of a threshold distribution for the Lower page and the Middle page is set larger, and the interval between threshold distributions for the Middle page is set larger. This is adopted to speed up writing of the Lower page and to reduce the probability of data errors for the Middle page.

Figure 28A:
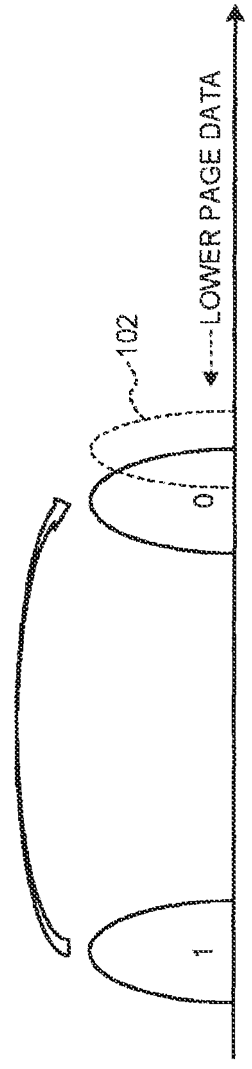
FIGS. 28A to 28C are views showing examples of threshold distributions after programming of respective pages according to a ninth embodiment.
Figure 28B:
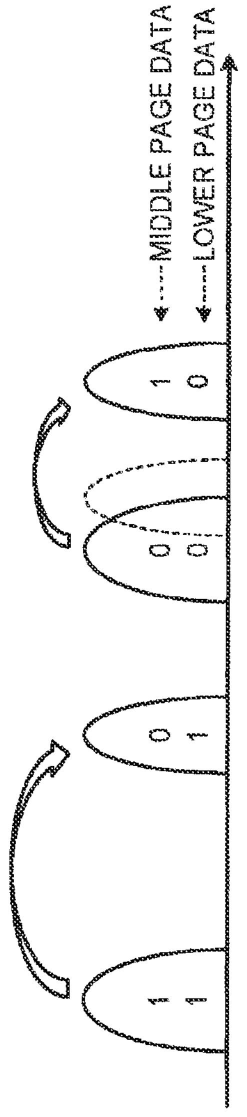
Figure 28C:
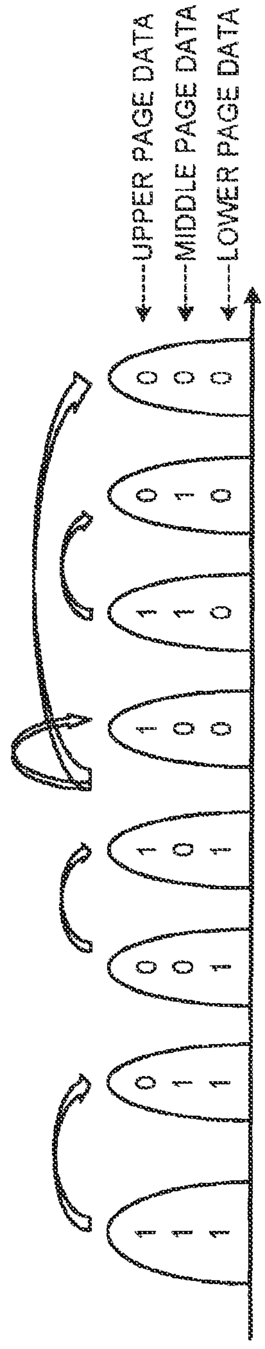

FIGS. 28A to 28C are views showing examples of threshold distributions after programming of respective pages according to this embodiment. FIGS. 28A, 28B, and 28C show examples of threshold distributions after programming of the Lower page, the Middle page, and the Upper page, respectively. According to this embodiment, the threshold distribution corresponding to the data value “0” after programming of the Lower page has a larger width and a lower center voltage, as compared with the distribution 102 corresponding to the data value “0” after programming of the Lower page shown in FIG. 18A according to the third embodiment. Consequently, after programming of the Middle page, the interval between the threshold distribution corresponding to the data value “00” and the threshold distribution corresponding to the data value “10” is expanded.

When the width of a threshold distribution is set larger as described above, the rise width at each programming pulse of a programming voltage applied to the word line in programming of the Lower page can be made larger than those of the Middle page and the Upper page. Consequently, the distribution width adjustment can be performed more roughly and so the programming time can be shortened. Further, since the interval between threshold distributions for the Middle page is larger, the data error probability is lowered, and so data reading can be performed more accurately. By utilizing this, it is possible to use only the Lower page as binary data, which allows programming to be performed at a higher rate and more reliably.

In the third embodiment, the threshold distribution corresponding to the data value “100” in programming of the Upper page is the same as the threshold distribution corresponding to the data value “00” after programming of the Middle page, and so there is no need to perform programming for the data value “100” in writing of the Upper page. On the other hand, in this embodiment, in writing of the Upper page, for the data value “100”, programming needs to be performed to obtain the threshold distribution corresponding to the data value “100” shown in FIG. 28C.

The example described above is explained as a modification of the third embodiment. However, another embodiment may be similarly modified in relation to at least some of the threshold distributions after programming of the Lower page and the Middle page, such that the width of a threshold distribution is set larger, and the interval of threshold distributions for the Middle page is set larger.

As described above, in this embodiment, in relation to at least some of the threshold distributions after programming of the Lower page and the Middle page, the width of a threshold distribution is set larger and the interval of threshold distributions for the Middle page is set larger. Consequently, this embodiment can shorten the programming time, and can reduce reading errors for the Middle page.

Tenth Embodiment

Next, an explanation will be given of threshold distributions in a memory device according to a tenth embodiment. This embodiment employs a memory device and a nonvolatile memory 2 that have the same configurations as those of the first embodiment. Further, this embodiment employs the same data coding as the first embodiment. Hereinafter in this embodiment, an explanation will be given of differences from the first embodiment.

In this embodiment, similarly to the ninth embodiment, as a modification of the data coding described in the third embodiment, the width of a threshold distribution for the Lower page and the Middle page is set larger, and the interval between threshold distributions for the Middle page is set larger.

Figure 29A:
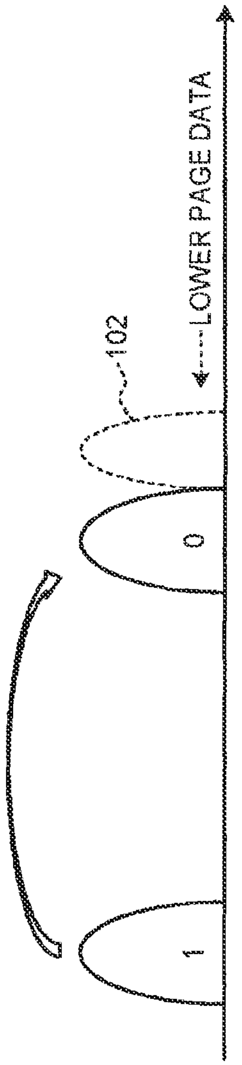
FIGS. 29A to 29C are views showing examples of threshold distributions after programming of respective pages according to a tenth embodiment.
Figure 29B:
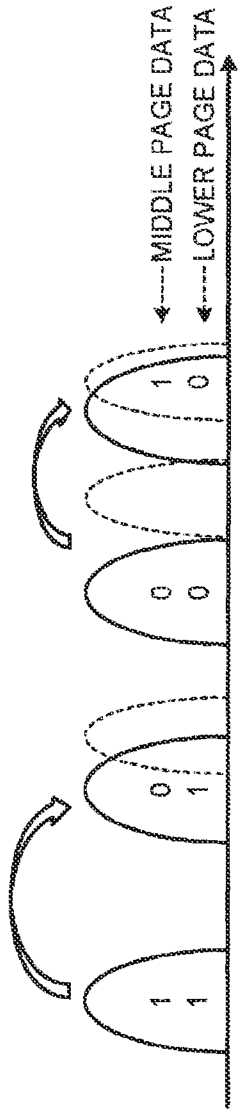
Figure 29C:
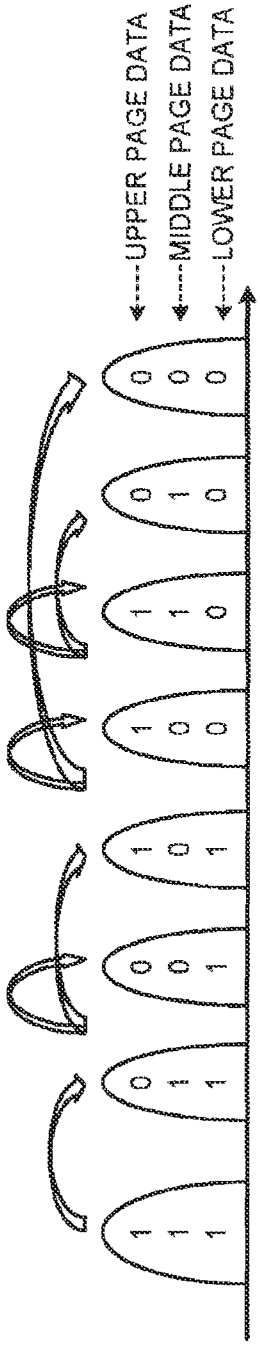

FIGS. 29A to 290 are views showing examples of threshold distributions after programming of respective pages according to this embodiment. FIGS. 29A, 29B, and 29C show examples of threshold distributions after programming of the Lower page, the Middle page, and the Upper page, respectively. According to this embodiment, the threshold distribution corresponding to the data value “0” after programming of the Lower page is shifted further toward the lower voltage side, as compared with the ninth embodiment. In FIGS. 29A to 29C, the distribution 102 shows a threshold distribution according to the third embodiment. In FIGS. 29A to 29C, only one distribution is provided with this reference symbol, but the threshold distributions shown by dotted lines indicate threshold distributions according to the third embodiment, similarly to the distribution provided with the reference symbol. After programming of the Middle page, each of the threshold distribution corresponding to the data value “01” and the threshold distribution corresponding to the data value “10” has a larger width and a lower center voltage, as compared with the threshold distribution according to the third embodiment.

Consequently, after programming of the Middle page, the interval between the threshold distribution corresponding to the data value “00” and the threshold distribution corresponding to the data value “10” is expanded. In this case, the rise width at each programming pulse of a programming voltage applied to the word line in programming the Lower page and the Middle page can be made larger than that of the Upper page. Consequently, the distribution width adjustment can be performed more roughly and so the programming time can be shortened. Further, since the interval between threshold distributions for the Middle page is larger, the data error probability is lowered, and so data reading can be performed more accurately. By utilizing this, itis possible to use only the Lower page as binary data, which allows programming to be performed at a higher rate and more reliably.

In the third embodiment, the threshold distributions corresponding to the data values “001”, “100”, and “110” in programming of the Upper page are respectively the same as the threshold distributions corresponding to the data values “01”, “00”, and “10” after programming of the Middle page, and so there is no need to perform programming for them. However, in this embodiment, in programming of the Upper page, the programming needs to be performed to set the threshold distributions corresponding to the data values “001”, “100”, and “110” to be threshold distributions shown in FIG. 29C.

The example described above is explained as a modification of the third embodiment. However, another embodiment may be similarly modified in relation to at least scare of the threshold distributions after programming of the Lower page and the Middle page, such that the width of a threshold distribution is set larger, and the interval of Threshold distributions for the Middle page is set larger.

As described above, in this embodiment, in relation to at least some of the threshold distributions after programming of the Lower page and the Middle page, the width of a threshold distribution is set larger and the interval of threshold distributions for the Middle page is set larger. Consequently, this embodiment can shorten the programming time, and can reduce reading errors for the Middle page.

Eleventh Embodiment

Next, an explanation will be given of threshold distributions in a memory device according to an eleventh embodiment. This embodiment employs a memory device and a nonvolatile memory 2 that have the same configurations as those of the first embodiment. Further, this embodiment employs the same data coding as the fourth embodiment. Hereinafter in this embodiment, an explanation will be given of differences from the fourth embodiment.

For example, in the data coding according to the fourth embodiment, the threshold distribution corresponding to the data value “11” and the threshold distribution corresponding to the data value “01” after programming of the Middle page become distributions adjacent to each other in the final distributions after programming of the Upper page. Accordingly, regardless of a small number of distributions used for the Middle page, the data error probability comes to be equivalent to that of after programming of the Upper page, in reading using the read voltage serving as the boundary between the distributions adjacent to each other. Particularly, the erased distribution (distribution Er) is not subjected to voltage compensation by programming thereafter, and so it allows accumulation of stresses (program disturb, read disturb, and/or data retention), which may cause data errors. Accordingly, in general, the erased distribution has a data error probability higher than the other data distributions, and so the error generation probability becomes higher if the erased distribution and the distribution adjacent to the erased distribution are used. In light of this problem, in this embodiment, the distribution interval between the erased distribution and its adjacent distribution is set larger than the intervals between the other distributions, to reduce the data error probability for the Middle page.

Figure 30A:
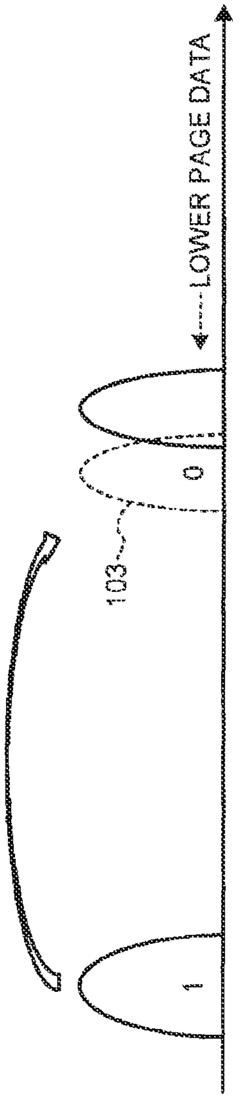
FIGS. 30A to 30C are views showing examples of threshold distributions after programming of respective pages according to an eleventh embodiment.
Figure 30B:
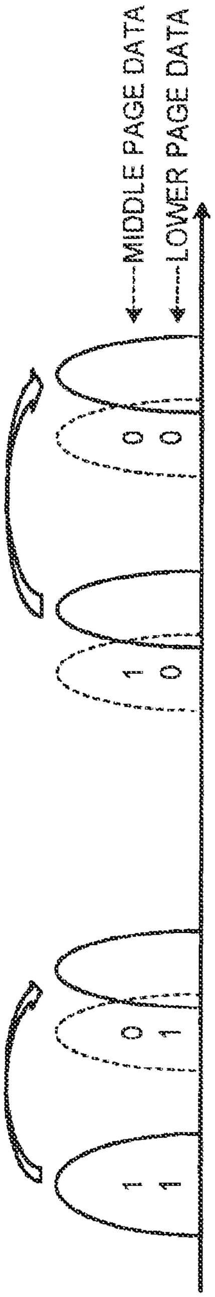
Figure 30C:
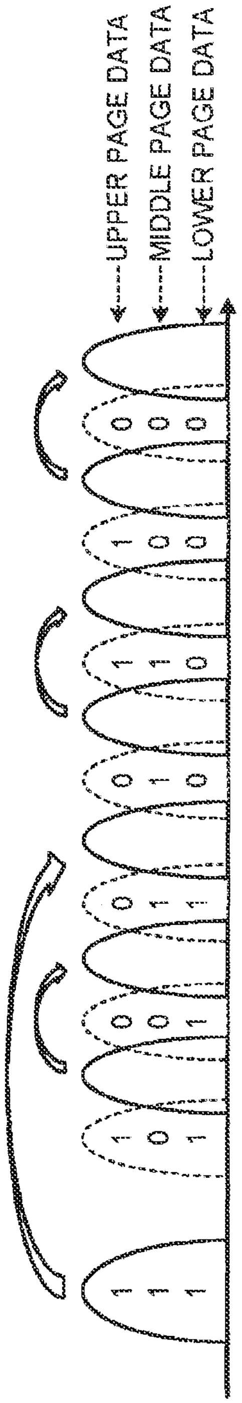

FIGS. 30A to 30C are views showing examples of threshold distributions after programming of respective pages according to this embodiment. FIGS. 30A, 30B, and 30C show examples of threshold distributions after programming of the Lower page, the Middle page, and the Upper page, respectively. In FIGS. 30A to 30C, the threshold distributions 103 shown by dotted lines indicate threshold distributions according to the fourth embodiment. In FIGS. 30A to 30C, when data coding is performed as in the fourth embodiment, the center voltages of the data distributions other than the erased distribution are set higher than those of the threshold distributions 103 according to the fourth embodiment, so that the interval between the erased distribution and its adjacent distribution is expanded. Consequently, in reading using the read voltage between the erased distribution and its adjacent distribution, the data error probability is lowered, and so data reading can be performed more accurately.

The example described above is explained as a modification of the fourth embodiment. However, another embodiment (first embodiment, second embodiment, or sixth embodiment), in which threshold distributions after programming of the Middle page become distributions adjacent to each other in the final distributions after programming of the Upper page, may be similarly modified such that the center voltages of the data distributions other than the erased distribution are set higher.

As described above, in a case where threshold distributions after programming of the Middle page become distributions adjacent to each other in the final distributions after programming of the Upper page, the center voltages of the data distributions other than the erased distribution are set higher, and, in other words, the interval between the erased distribution and its distribution is set larger than the intervals between the other distributions. Consequently, is reading using the read voltage between the erased distribution and its adjacent distribution, the data error probability is lowered, and so data reading can be performed more accurately.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile memory comprising:

a word line;

a plurality of memory cells connected to the word line, each of the plurality of memory cells configured to store data by correlating three bits with eight threshold regions, the eight threshold regions respectively corresponding to first to eighth threshold regions defined in ascending order of threshold voltage, the three hits respectively corresponding to first to third pages, a threshold voltage of an unwritten state of the memory cells being set at the first threshold region and a control unit configured to:

when writing a first value to the first page of an unwritten memory cell, perform programming such that the threshold voltage of the unwritten memory cell is within the second threshold region;

when performing writing of the second page of the memory cell whose first page has been subjected to writing, if a value corresponding to the first page of the memory cell is a second value and a value to be written to the second page is the first value, perform programming such that the threshold voltage of the memo cell is within the fourth threshold region, and if a value corresponding to the first page of the memory cell is the first value and a value to be written to the second page is the first value, perform programming such that the threshold voltage of the memory cell is within the third threshold region;

when performing writing of the third page of the memory cell whose second page has been subjected to writing, if a value corresponding to the first page of the memory cell is the second value, a value corresponding to the second page of the memory cell is the second value, and a value to be written to the third page is the first value, perform programming such that the threshold voltage of the memory cell is within the sixth threshold region, if a value corresponding to the first page of the memory cell is the first value, a value corresponding to the second page of the memory cell is the second value, and a value to be written to the third page is the first value, perform programming such that the threshold voltage of the memory cell is within the seventh threshold region, if a value corresponding to the first page of the memory cell is the first value, a value corresponding to the second page of the memory cell is the first value, and a value to be written to the third page is the first value, perform programming such that the threshold voltage of the memory cell is within the eighth threshold region, and if a value corresponding to the first page of the memory cell is the second value, a value corresponding to the second page of the memory cell is the first value, and a value to be written to the third page is the first value, perform programming such that the threshold voltage of the memory cell is within the fifth threshold region;

when reading out data from the first page, read out the data using a first, a third, and a sixth read voltage, the first read voltage being a boundary voltage between the first threshold region and the second threshold region, the third read voltage being a boundary voltage between the third threshold region and the fourth threshold region, the sixth read voltage being a boundary voltage between the sixth threshold region and the seventh threshold region, and determine data of the first page on a basis of the read out data;

when reading out data from the second page, read out the data using a second, a fifth, and a seventh read voltage, the second read voltage being a boundary voltage between the second threshold region and the third threshold region, the fifth read voltage being a boundary voltage between the fifth threshold region and the sixth threshold region, the seventh read voltage being a boundary voltage between the seventh threshold region and the eighth threshold region, and determine data of the second page on a basis of the read out data; and when reading out data from the third page, read out the data using a fourth read voltage, the fourth read voltage being a boundary voltage between the fourth threshold region and the fifth threshold region, and determine data of the third page on a basis of the read out data, wherein the control unit is configured to perform the programming by applying a voltage to the word line, and a rise width at each pulse of the applied voltage applied to the word line of the first pan is larger than that of the second page and the third page.

2. The nonvolatile memory according to claim 1, wherein the first value is “0”, and the second value is “1”.

3. The nonvolatile memory according to claim 1, wherein a maximum number among a first number, a second number, and a third number is three, the first number being a number of boundaries of the threshold regions to determine data of the first page, the second number being a number of boundaries of the threshold regions to determine data of the second page, the third number being a number of boundaries of the threshold regions to determine data of the third page.

4. The nonvolatile memory according to claim 1, wherein the control unit is configured to, when reading out data from unwritten page that is one of the first to the third pages, output “0” as a reading result.

5. The nonvolatile memory according to claim 1, wherein manage information about how many pages, of the first to third pages, for which writing has been performed to is not managed.

6. The nonvolatile memory according to claim 1, wherein an interval between the first threshold region and the second threshold region is larger than an interval between any two other directly adjacent threshold regions among the eight threshold regions.

7. The nonvolatile memory according to claim 1, wherein the control unit is configured to perform the programming by applying a voltage to the word line.

8. The nonvolatile memory according to claim 7, wherein a rise width at each pulse of the applied voltage applied to the word line of the first page and the second page is larger than that of the third page.

9. The nonvolatile memory according to claim 1, wherein the nonvolatile memory is a NAND flash memory.

10. A memory system comprising:

a nonvolatile memory including a word line and a plurality of memory cells connected to the word line; each of the plurality of memory cells being configured to store data by correlating three bits with eight threshold regions, the eight threshold regions respectively corresponding to first to eighth threshold regions defined in ascending order of threshold voltage, the three hits respectively corresponding to first to third pages, a threshold voltage of an unwritten state of the memory cells being set at the first threshold region; and a memory controller configured to control writing of the nonvolatile memory, wherein the nonvolatile memory further includes a control unit configured to write data associated with a writing request from the memory controller to the memory cells, and the control unit configured to:

when writing a first value to the first page of an unwritten memory cell, perform programming such that the threshold voltage of the unwritten memory cell is within the second threshold region;

when performing writing of the second page of the memory cell whose first page has been subjected to writing, if a value corresponding to the first page of the memory cell is a second value and a value to be written to the second page is the first value, perform programing such that the threshold voltage of the memory cell is within the fourth threshold region, and if a value corresponding to the first page of the memory cell is the first value and a value to be written to the second page is the first value, perform programming such that the threshold voltage of the memory cell is within the third threshold region;

when performing writing of the third page of the memory cell whose second page has been subjected to writing, if a value corresponding to the first page of the memory cell is the second value, a value corresponding to the second page of the memory cell is the second value, and a value to be written to the third page is the first value, perform programming such that the threshold voltage of the memory cell is within the sixth threshold region, if a value corresponding to the first page of the memory cell is the first value, a value corresponding to the second page of the memory cell is the second value, and a value to be written to the third page is the first value, perform programming such that the threshold voltage of the memory cell is within the seventh threshold region, if a value corresponding to the first page of the memory cell is the first value, a value corresponding to the second page of the memory cell is the first value, and a value to be written to the third page is the first value, perform programming such that the threshold voltage of the memory cell is within the eighth threshold region, and if a value corresponding to the first page of the memory cell is the second value, a value corresponding to the second page of the memory cell is the first value, and a value to be written to the third page is the first value, perform programming such that the threshold voltage of the memory cell is within the fifth threshold region;

when reading out data from the first page, read out the data using a first, a third, and a sixth read voltage, the first read voltage being a boundary voltage between the first threshold region and the second threshold region, the third read voltage being a boundary voltage between the third threshold region and the fourth threshold region, the sixth read voltage being a boundary voltage between the sixth threshold region and the seventh threshold region, and determine data of the first page on a basis of the read out data;

when reading out data from the second page, read out the data using a second, a fifth, and a seventh read voltage, the second read voltage being a boundary voltage between the second threshold region and the third threshold region, the fifth read voltage being a boundary voltage between the fifth threshold region and the sixth threshold region, the seventh read voltage being a boundary voltage between the seventh threshold region and the eighth threshold region, and determine data of the second page on a basis of the read out data; and when reading out data from the third page, read out the data using a fourth read voltage, the fourth read voltage being a boundary voltage between the fourth threshold region and the fifth threshold region, and determine data of the third page on a basis of the read out data, wherein the control unit is configured to perform the programming by applying a voltage to the word line, and a rise width at each pulse of the applied voltage applied to the word line of the first me is larger than that of the second page and the third page.

11. The memory system according to claim 10, wherein the first value is “0”, and the second value is “1”.

12. The memory system according to claim 10, wherein a maximum number among a first number, a second number, and a third number is three, the first number being a number of boundaries of the threshold regions to determine data of the first page, the second number being a number of boundaries of the threshold regions to determine data of the second page, the third number being a number of boundaries of the threshold region to determine data of the third page.

13. The memory system according to claim 10, wherein the control unit is configured to, when reading out data from unwritten page that is one of the first to the third pages, output “0” as a reading result.

14. The memory system according to claim 10, wherein manage information about how many pages, of the first to third pages, for which writing has been performed to is not managed.

15. The memory system according to claim 10, wherein an interval between the first threshold region and the second threshold region is larger than an interval between any two other directly adjacent threshold regions among the eight threshold regions.

16. The memory system according to claim 10, wherein the control unit is configured to perform the programming by applying a voltage to the word line.

17. The memory system according to claim 16, wherein a rise width at each pulse of the applied voltage applied to the word line of the first page and the second page is larger than that of the third page.

18. The memory system according to claim 10, wherein the nonvolatile memory is a NAND flash memory.

* * * * *